US008627172B2

(12) United States Patent
Kamiya

(10) Patent No.: US 8,627,172 B2
(45) Date of Patent: Jan. 7, 2014

(54) ERROR CORRECTION ENCODING APPARATUS, DECODING APPARATUS, ENCODING METHOD, DECODING METHOD, AND PROGRAMS THEREOF

(75) Inventor: Norifumi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 218 days.

(21) Appl. No.: 13/139,785

(22) PCT Filed: Dec. 11, 2009

(86) PCT No.: PCT/JP2009/070756
§ 371 (c)(1),
(2), (4) Date: Jun. 15, 2011

(87) PCT Pub. No.: WO2010/073922
PCT Pub. Date: Jul. 1, 2010

(65) Prior Publication Data
US 2012/0089884 A1    Apr. 12, 2012

(30) Foreign Application Priority Data
Dec. 25, 2008  (JP) ................................. 2008-330910

(51) Int. Cl.
*H03M 13/00*       (2006.01)
(52) U.S. Cl.
USPC ....................................................... 714/758
(58) Field of Classification Search
USPC .................................................. 714/752, 758
See application file for complete search history.

(56) References Cited

U.S. PATENT DOCUMENTS

| 2003/0002533 A1* | 1/2003 | Rajwan ......................... 370/474 |
| 2009/0187804 A1* | 7/2009 | Shen et al. ..................... 714/752 |
| 2010/0023838 A1* | 1/2010 | Shen et al. ..................... 714/758 |

(Continued)

FOREIGN PATENT DOCUMENTS

| JP | 2008187706 A | 8/2008 |
| WO | 2006106841 A | 10/2006 |
| WO | 2007083066 A | 7/2007 |

OTHER PUBLICATIONS

This paper appears in: Information Theory, IEEE Transactions; Date of Publication: Aug. 2004; Author(s): Fossorier, Marc P C ; Dept. of Electr. Eng., Univ. of Hawaii, Honolulu, HI, USA; vol. 50 , Issue: 8 ; pp. 1788-1793 ; Product Type: Journals & Magazines.*

(Continued)

*Primary Examiner* — Ajay Bhatia
*Assistant Examiner* — Thien D Nguyen

(57) ABSTRACT

Provided is an encoding apparatus wherein a transmission data sequence is divided into L short sequences, each of which is then encoded by use of an m-stage pseudo-cyclic low-density parity check encoding system. Each of the L encoded sequences is further divided into shorter sequences, the number of which is identical to the number m of the stages of the pseudo-cyclic codes and each of which has a length m. The shorter sequences are rearranged in order by a replacing module, thereafter encoded, by use of the m-stage pseudo-cyclic low-density parity check encoding system, and outputted. Accordingly, a decoding apparatus with a simple structure where node processing circuits (e.g., minimum-value calculating circuits), the number of which is p that is a submultiple of the number m of the foregoing stages, are provided, can be employed to efficiently decode the codes having a large frame length and a large encoding gain.

18 Claims, 12 Drawing Sheets

(56) References Cited

U.S. PATENT DOCUMENTS

2010/0115371 A1* 5/2010 Shen et al. .................. 714/752
2010/0185913 A1* 7/2010 Liao et al. .................. 714/752
2011/0026639 A1* 2/2011 Rouquette-Leveil et al. 375/298

OTHER PUBLICATIONS

International Search Report for PCT/JP2009/070756 mailed Mar. 2, 2010.
R. G. Gallager, "Low-Density Parity-Check Codes", IRE Transactions On Information Theory, Jan. 1962, pp. 21-28.
D. J. C Mackay, "Good Error-Correcting Codes Based on Very Sparse Matrices", IEEE Transactions on Information Theory, vol. 45, No. 2, Mar. 1999, pp. 399-431.
K. Kambara et al., "Study of FEC for 800MHz band FPU system—Analysis of LDGM structure for LDPC concatenated code—", IEICE Technical Report, RC82008-79, vol. 108, No. 188, Aug. 27, 2008, pp. 157-162.
Yusuke Kumano et al., "Turbo Decoding for Serially-Concatenated Low-Density Generator Matrix (SCLDGM) Codes", IEICE Technical Report (RCS2008-109), Oct. 15, 2008, vol. 108, No. 249, pp. 37-42.
Zhongwang Li et al., "Efficient Encoding of Quasi-Cyclic Low-Density Parity-Check Codes", Communications, IEEE Transactions on, Jan. 2006, vol. 54, No. 1, pp. 71-81.
Yoshikuni Miyata et al., "A Study on LDPC Codes for Optical Communications using Concatenation to Combat Error-floor", Proceedings of the 2008 IEICE General Conference, Communication 2 (B-10-92), Mar. 5, 2008, p. 375.
Japanese Office Action for JP2010-544007 mailed on Jun. 11, 2013 with Partial English Translation.

* cited by examiner

ERROR CORRECTION ENCODING APPARATUS, DECODING APPARATUS, ENCODING METHOD, DECODING METHOD, AND PROGRAMS THEREOF

TECHNICAL FIELD

The present invention relates to an error correction encoding apparatus, a decoding apparatus, and the like. More specifically, the present invention is based on quasi-cyclic low density party check (LDPC), which relates to a an error correction encoding apparatus for correcting block errors which divides an information sequence into blocks of a specific length and adds a redundant sequence individually to each block, and to a decoding apparatus, an encoding method, a decoding method, as well as programs thereof.

BACKGROUND ART

In satellite communications, mobile telecommunication systems, or the like, an error correction encoding technique exhibiting a large encoding gain is employed in order to satisfy requirements in terms of the system structures such as reduction of required power, reduction in the size of antennas, and the like. In such case, low density parity check (LDPC) codes are known as an error correction codes exhibiting a large encoding gain, and more and more of the LDPC codes are employed to various kinds of communications systems described above or to storage devices of magnetic recording.

The low density parity check codes do not simply show a single error correction encoding method but is a general name for error correction codes having such a character that a check matrix is sparse (most components in a matrix are "0", and the number of component "1" is extremely small).

Through selecting a check matrix in a sparse state, it is possible to structure an error correction encoding method having a large encoding gain by using a repeat decoding method such as sum-product algorithm or a min-sum algorithm (see Non-Patent Documents 1, 2, for example).

Here, a block matrix of r×n is shown in Expression 1 (r, n are natural numbers satisfying r≤n). In each component of the block matrix shown in FIG. 1, $I_{i,j}$ shows a cyclic replacement matrix or zero matrix of m×m (symbol m is a natural number, symbol i is an integer between 0 and r−1, and symbol j is an integer between 0 and n−1).

$$H = \begin{bmatrix} I_{0,0} & I_{0,1} & \ldots & I_{0,n-1} \\ I_{1,0} & I_{1,1} & \ldots & I_{1,n-1} \\ \ldots & \ldots & \ldots & \ldots \\ I_{r-1,0} & I_{r-1,1} & \ldots & I_{r-1,n-1} \end{bmatrix} \quad \text{[Expression 1]}$$

The low density parity check encoding having the block matrix of Expression 1 as a check matrix is particularly called m-stage quasi-cyclic parity check codes. That is, a set of sequences whose matrix product with the matrix H is zero among all the information sequence of n×m bits is the m-stage quasi-cyclic parity check codes constituted with a frame length=n×m and a check matrix=H.

Regarding the sum-product and min-sum algorithm as the decoding methods of the low density parity check codes, decoding processing and the device for achieving the processing tend to become complicated as the stage number m becomes smaller with respect to the natural number n.

Therefore, it is possible to extend the frame length while suppressing the complication of the decoding processing by increasing the size m with the above-described cyclic replacement matrix $I_{i,j}$. However, with the low density parity check codes of such structure in general, a large increase in the encoding gain in accordance with the increase in the frame length cannot be expected.

There is Patent Document 1 described in the followings as a related technique regarding an error correction encoding apparatus which generates low density parity check codes from an input information sequence by using a low density parity check matrix. The technique depicted in Patent Document 1 includes a module which outputs the low density parity check matrix which is structured to continue a row in which cyclic replacement matrix in the same number as the weight of the row is arranged for the number of rows satisfying the prescribed weight distribution, and to gradually increase or decrease the weight of the row. This is designed to improve the performance compared to the methods using random number sequence.

Non-Patent Document 1: Robert Gallager "Low-Density Parity-Check Codes" pp. 21-28, IEEE Transactions On Information Theory, January 1962

Non-Patent Document 2: D. J. C Mackay, "Good Error-Correcting Codes Based On Very Sparse Matrices" pp. 399-431, IEEE Transactions On Information Theory, March 1999

Patent Document 1: WO2006/106841

DISCLOSURE OF THE INVENTION

Problems to be Solved by the Invention

With the error correction encoding method including the above-described low density parity check codes (Non-Patent Documents 1, 2), normally, a still larger encoding gain can be acquired as the frame length becomes longer. However, when the frame is extremely long, a large amount of calculations are required for the encoding and decoding processing, thereby resulting in complicating the encoding apparatus as well as the decoding apparatus and expanding the scales thereof.

Particularly, in a case where the frame length is extended by simply increasing the number of stages of the quasi-cyclic low-density parity check codes, there is only a small improvement in the gain of the encoding achieved in accordance with the increase in the frame length. Thus, this cannot result in achieving a substantial solution.

Further, the technique depicted in Patent Document 1 is designed to improve the performance of the entire error correction encoding apparatus by generating the low density parity check codes in a characteristic manner. Regarding the improvements in the gain of encoding achieved in accordance with the increase in the frame length, there is no direct relevancy.

An object of the present invention is to improve the inconveniences of the above-described related techniques and in particular to provide an encoding apparatus which can achieve a large encoding gain, an encoding method, and a program thereof, and also to provide a decoding apparatus with a simplified structure to operate in response to the encoding apparatus capable of acquiring the large encoding gain, which performs decoding processing of data encoded by the encoding apparatus in a small scale, as well as a decoding method and a program thereof.

Means for Solving the Problems

In order to achieve the foregoing object, the error correction encoding apparatus according to the present invention includes: a data dividing module which divides a transmission data sequence into L-pieces of short sequences; a first encoding module which encodes (error correction encoding) each of the divided L-pieces of short sequences to encoded sequences of length N by an m-stage quasi-cyclic low density parity check encoding method (L, m are natural numbers, N is a multiple of m), and output those encoded sequences; and a redundant sequence output module which generates a redundant sequence based on each of the encoded sequences of length N outputted from the first encoding module, and outputs the redundant sequence in a same manner as a plurality of encoded sequences outputted from the first encoding module.

Further, the redundant sequence output module is characterized to include: a data replacing module which inputs the L-pieces of encoded sequences of length N encoded by the first encoding module, and outputs each of the data sequences by changing an order thereof; and a second encoding module which encodes (error correction encoding) each of the replaced encoded sequences outputted from the data replacing module by the m-stage quasi-cyclic low density parity check encoding method, and outputs those encoded sequences.

Further, in order to achieve the foregoing object, the decoding apparatus according to the present invention is a decoding apparatus for decoding transmitted data encoded by an error correction encoding apparatus and correcting an error when the error is added to the data, and the decoding apparatus includes: a plurality of data storage modules which, among the data transmitted from the error correction encoding apparatus, separately store data of a plurality of encoded sequences processed by the first encoding module of the error correction encoding apparatus and data of a plurality of encoded sequences processed by the redundant sequence calculating module of the error correction encoding apparatus; and a memory controller for controlling storing operations of each of the data storage modules.

Further, the decoding apparatus includes a decoding update processing module provided by corresponding to each of the data storage modules to repeat, for number of times specified by the address generating procedure, an update operation which reads out the data held at addresses of each of the data storage modules according to an address generating procedure set in advance, performs update processing, and stores the data again to the same addresses of the original data storage modules. Furthermore, the memory controller has a decoded data output control function which, among the data held at each of the plurality of data storage modules, takes out highest-order bit of each symbol specified by the address generating procedure set in advance in a reversed procedure from that of the time of writing to each of the data storage modules, and outputs those as decoded data.

Further, in order to achieve the foregoing object, the error correction encoding method according to the present invention includes: dividing a transmission data sequence into L-pieces of short sequences by a data dividing module; encoding each of the divided L-pieces of short sequences to encoded sequences of length N by a first encoding module according to an m-stage quasi-cyclic low density parity check encoding method (L, m are natural numbers, N is a multiple of m); and generating a redundant sequence by a redundant sequence output module based on each of the encoded sequences of length N outputted from the first encoding module, and outputting the redundant sequence as redundant sequence data along with a plurality of encoded sequences outputted from the first encoding module.

Then, when outputting the redundant sequence data, the error correction encoding method is characterized to include: inputting the L-pieces of encoded sequences of length N encoded by the first encoding module to a data replacing module, and outputting each of the data sequences by changing an order thereof; and thereafter, performing encoding (error correction encoding) on each of the replaced and outputted encoded sequences by a second encoding module according to the m-stage quasi-cyclic low density parity check encoding method.

Further, in order to achieve the foregoing object, the decoding method according to the present invention is a decoding method for decoding transmitted data encoded by an error correction encoding apparatus and correcting an error when the error is added to the data, and the method is characterized to include: among the data transmitted from the error correction encoding apparatus, separately storing data of a plurality of encoded sequences processed by a first encoding module of the error correction encoding apparatus and data of a plurality of encoded sequences processed by a redundant sequence calculating module of the error correction encoding apparatus to a plurality of data storage modules; repeating an update operation by a decoding update processing module provided by corresponding to each of the data storage modules for a number of times specified by an address generating procedure, the update operation including reading out the data held at addresses of each of the data storage modules according to the address generating procedure set in advance, performing update processing, and storing the data again to the same addresses of the original data storage modules; and among the data held at each of the plurality of data storage modules, executing a decoded data output control step by a memory controller for taking out highest-order bit of each symbol specified by the address generating procedure set in advance in a reversed procedure from that of the time of writing to each of the data storage modules, and outputting those as decoded data.

Further, in order to achieve the foregoing object, the error correction encoding processing program according to the present invention is characterized as a program for causing a computer to execute: a data dividing processing function which divides a transmission data sequence into L-pieces of short sequences; a first encoding processing function which performs encoding (error correction encoding) on each of the divided L-pieces of short sequences to encoded sequences of length N by an m-stage quasi-cyclic low density parity check encoding method (L, m are natural numbers, N is a multiple of m), and outputs those encoded sequences; and a redundant sequence output processing function which generates a redundant sequence based on each of the encoded sequences of length N generated by executing the first encoding processing function, and outputs the redundant sequence in a same manner as a plurality of encoded sequences generated and outputted by the first encoding processing function, wherein the redundant sequence output processing function includes: a data replacement processing function which inputs the L-pieces of encoded sequences of length N encoded by the first encoding processing function, and performs output processing of each of the data sequences by changing an order thereof; and a second encoding processing function which performs encoding (error correction encoding) on each of the replaced encoded sequences outputted thereby by the m-stage quasi-cyclic low density parity check encoding method, and outputs those encoded sequences.

Further, in order to achieve the foregoing object, the decoding processing program according to the present invention is a decoding processing program for executing, on a decoding apparatus, decoding processing of data regarding transmission data sequence encoded and transmitted through execution of an error correction encoding processing program on an error correction encoding apparatus and for correcting an error when the error is added thereto, which is characterized to cause a computer to execute: a storing operation control function which, among the data regarding the encoded and transmitted transmission data sequence, separately stores data of a plurality of encoded sequences processed by a first encoding processing function executed on the error correction encoding apparatus and data of a plurality of encoded sequences processed by a redundant sequence output processing function executed on the error correction encoding apparatus to each of a plurality of data storage modules; a decoding update processing function which repeats an update processing operation for a number of times specified by an address generating procedure, the update processing operation including reading out the data held at addresses of each of the data storage modules according to the address generating procedure set in advance, performing update processing, and storing the data again to the same addresses of the original data storage modules; and a decoded data output control function which, among the data held at each of the plurality of data storage modules, takes out highest-order bit of each symbol specified by the address generating procedure set in advance in a reversed procedure from that of the time of writing to each of the data storage modules, and outputs those as decoded data.

Effect of the Invention

As described above, the present invention is basically structured to execute the encoding by a plurality of combinations such as executing encoding by one of the encoding modules by using the m-stage quasi-cyclic low density parity check encoding method and further encoding the replaced output of the redundant sequence via the data replacing module by using the other encoding module. This makes it possible to provide such an excellent effect that the encoding gain is greatly improved by the increase in the frame length.

Further, when decoding the encoded data sequence, the same decoding processing corresponding to the m-stage quasi-cyclic low density parity check codes as in the case of the transmission data sequence encoding described above is executed on the receiver side even when data sequence of the increased frame length is transmitted. Thus, it is possible to perform the decoding processing without increasing the circuit scale and the number of memories to be used. This provides excellent effects of increasing the speed of the decoding processing and suppressing the power consumption at the time of the decoding processing operations.

BEST MODES FOR CARRYING OUT THE INVENTION

First Exemplary Embodiment

Next, a first exemplary embodiment of an error correction encoding apparatus and a decoding apparatus corresponding to the encoding apparatus according to the present invention will be described by referring to FIG. 1 to FIG. 9.

The encoding apparatus according to the first exemplary embodiment includes a transmission data sequence input module which inputs transmission data sequence of a length K and a redundant sequence calculating module which calculates a redundant sequence from the inputted transmission data sequence, and the encoding apparatus is structured to output the redundant sequence and the transmission data sequence towards the corresponding decoding apparatus to perform decoding.

Figure 1:
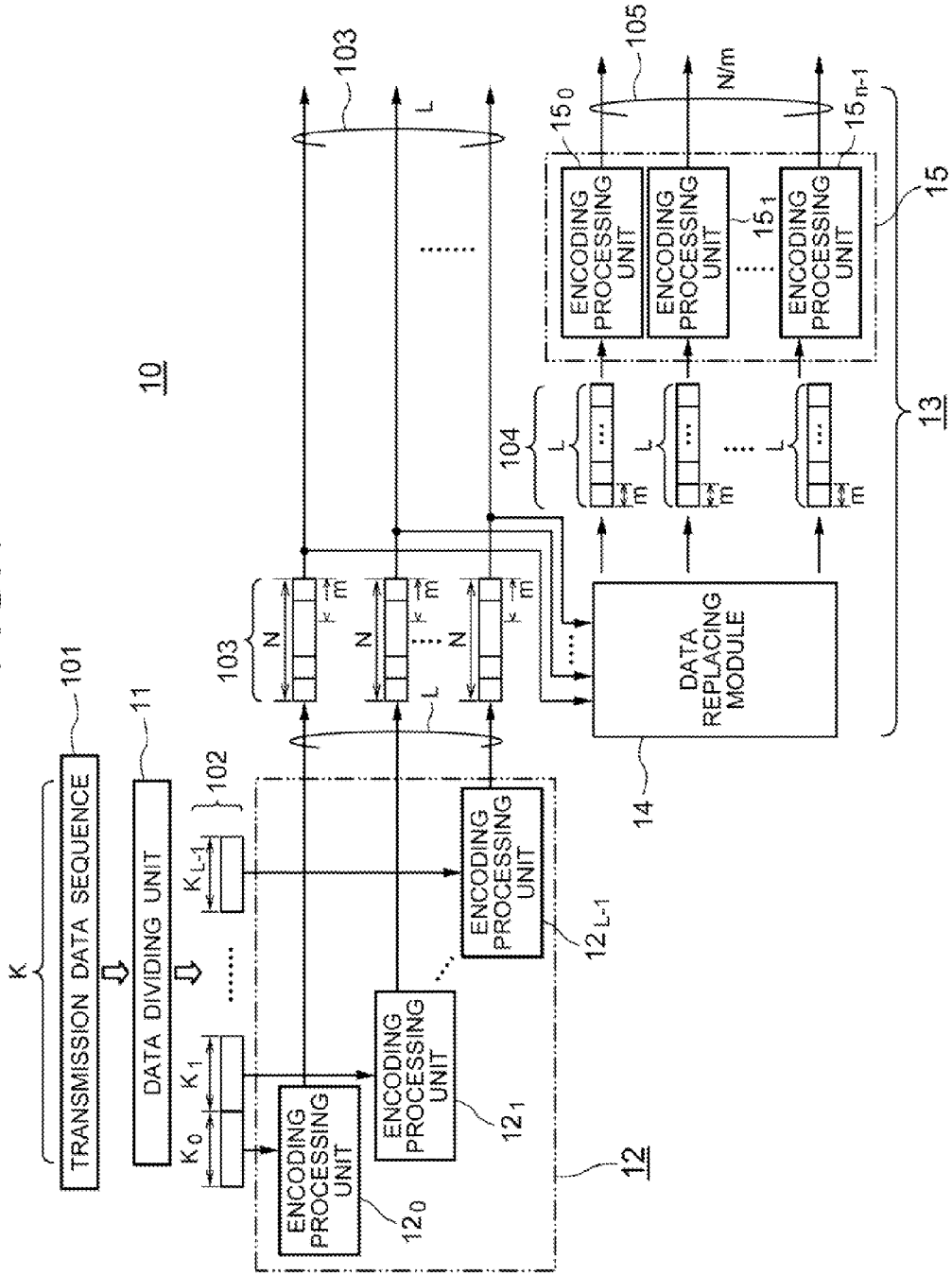
FIG. 1 is a block diagram showing an error correction encoding apparatus part of a first exemplary embodiment according to the present invention.
Figure 2:
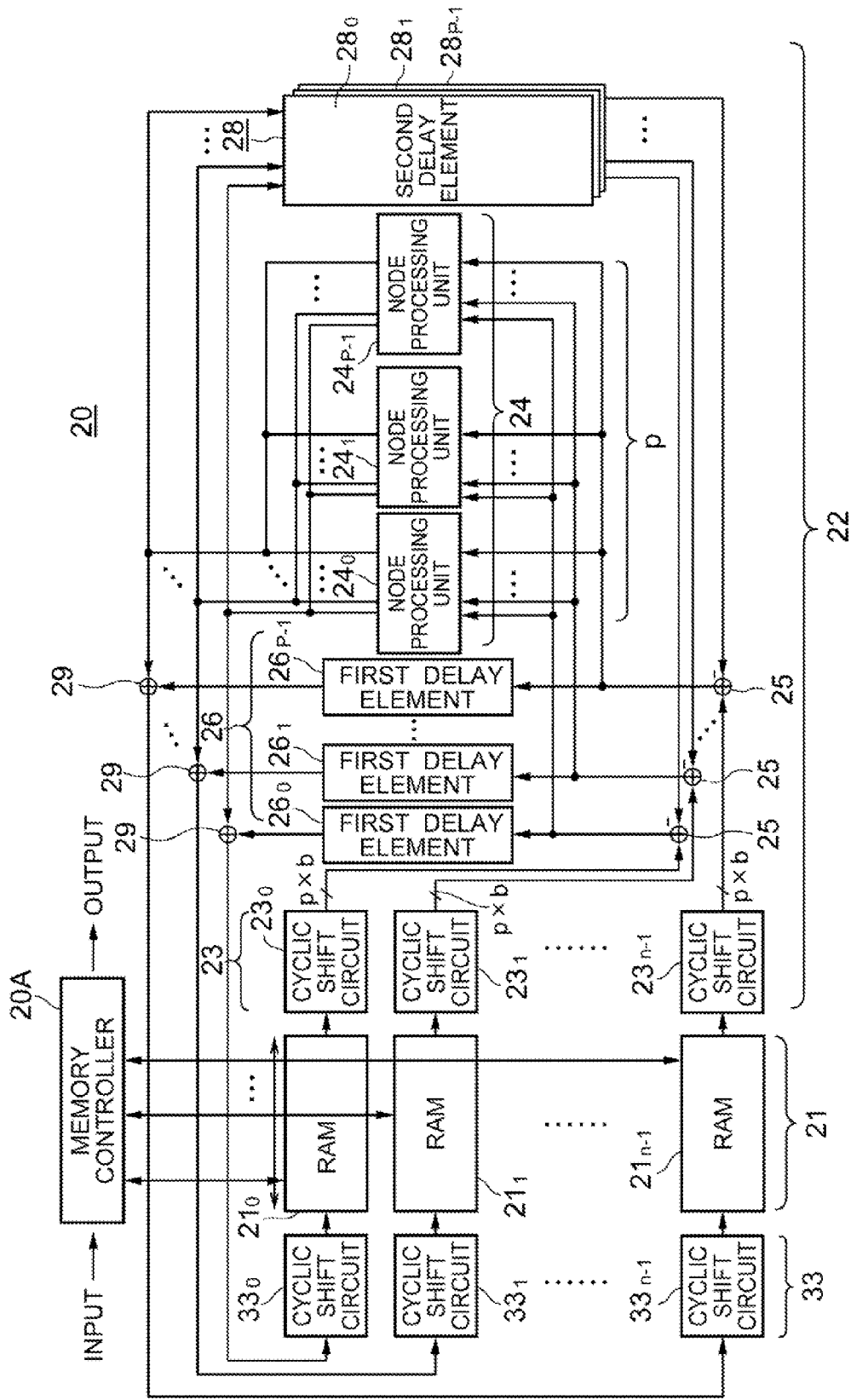
FIG. 2 is a block diagram showing a decoding apparatus part of the first exemplary embodiment according to the present invention.

The error correction encoding apparatus 10 according to the first exemplary embodiment is shown in FIG. 1, and the decoding apparatus 20 which decodes and outputs the encoded data outputted from the encoding apparatus 10 is shown in FIG. 2.

(Structure of Error Correction Encoding Apparatus 10)

As shown in FIG. 1, the error correction encoding apparatus 10 according to the first exemplary embodiment includes: a data dividing module 11 which divides a transmission data sequence 101 of length K into L-pieces of short sequences; a first encoding module 12 which performs encoding (error correction encoding) on each of the L-pieces of divided short sequences into encoded sequence of length N by an m-stage quasi-cyclic low density parity check encoding method (L, m are natural numbers, and N is a multiple of m) and outputs the encoded sequences; and a redundant sequence output module 13 which generates redundant sequences based on each of the encoded sequence 103 of length N outputted from the first encoding module 12, and outputs the redundant sequences in the same manner as a plurality of encoded sequences 103 outputted from the first encoding module 12.

The redundant sequence output module 13 is structured by including: a data replacing module 14 which inputs the L-pieces of encoded sequences 103 of length N encoded by the first encoding module 12, and outputs those by changing the order of each data sequence; and a second encoding module 15 which encodes each of the replaced encoded sequences outputted from the data replacing module 14 through performing encoding (error correction encoding) by using the m-stage quasi-cyclic low density parity check encoding method, and outputs those.

This will be described in more details.

As described above, the encoding apparatus 10 shown in FIG. 1 is an apparatus which inputs the transmission data sequence 101 of length K (K is a natural number), calculates the redundant sequence from the transmission data sequence 101 of length K, and outputs the encoded sequence that is a mixture of the transmission data sequence and the redundant sequence.

Among those, the first encoding module 12 is constituted with L-pieces of encoding processing units $12_0$, $12_1$, - - - , $12_{L-1}$ which are encoders of a plurality of m-stage quasi-cyclic low density parity check (LDPC) codes having the check matrix of Expression 1. The symbol m shows a natural number.

That is, the first encoding module 12 as the m-stage low density parity check encoding module of FIG. 1 has a function of encoding each of the L-pieces of transmission data sequences of length K (L is a natural number) into sequence of Length N, respectively, and outputting those.

The first encoding module 12 is provided with the data replacing module 14 that has a cyclic replacement function which inputs each output of the L-pieces of encoding processing units $12_0$, $12_1$, - - - , $12_{L-1}$ of the encoding module 12 and outputs each of a plurality of data sequences by changing the order thereof. Reference numeral 104 shows a plurality of data sequences outputted from the data replacing module 14.

On the output side of the data replacing module 14, the second encoding module 15 which functions in the same manner as the above-described first encoding module 13 is provided.

The second encoding module 15 has a function of encoding (error correction encoding) each of the output sequences of the data replacing module 14 into sequences of length that is equal to or smaller than (L+S)×m and outputting those. The second encoding module 15 is constituted with N/m-pieces of encoding processing units $15_0$, $15_1$, - - - , $15_{L-1}$ (1-2) which are encoders of a plurality of m-stage quasi-cyclic low density parity check (LDPC) codes functioning in the same manner as the first encoding module 12 described above. Thereby, the second encoding module 15 transmits and outputs a plurality of encoded and redundant data towards the decoding apparatus as will be described later.

Figure 3:
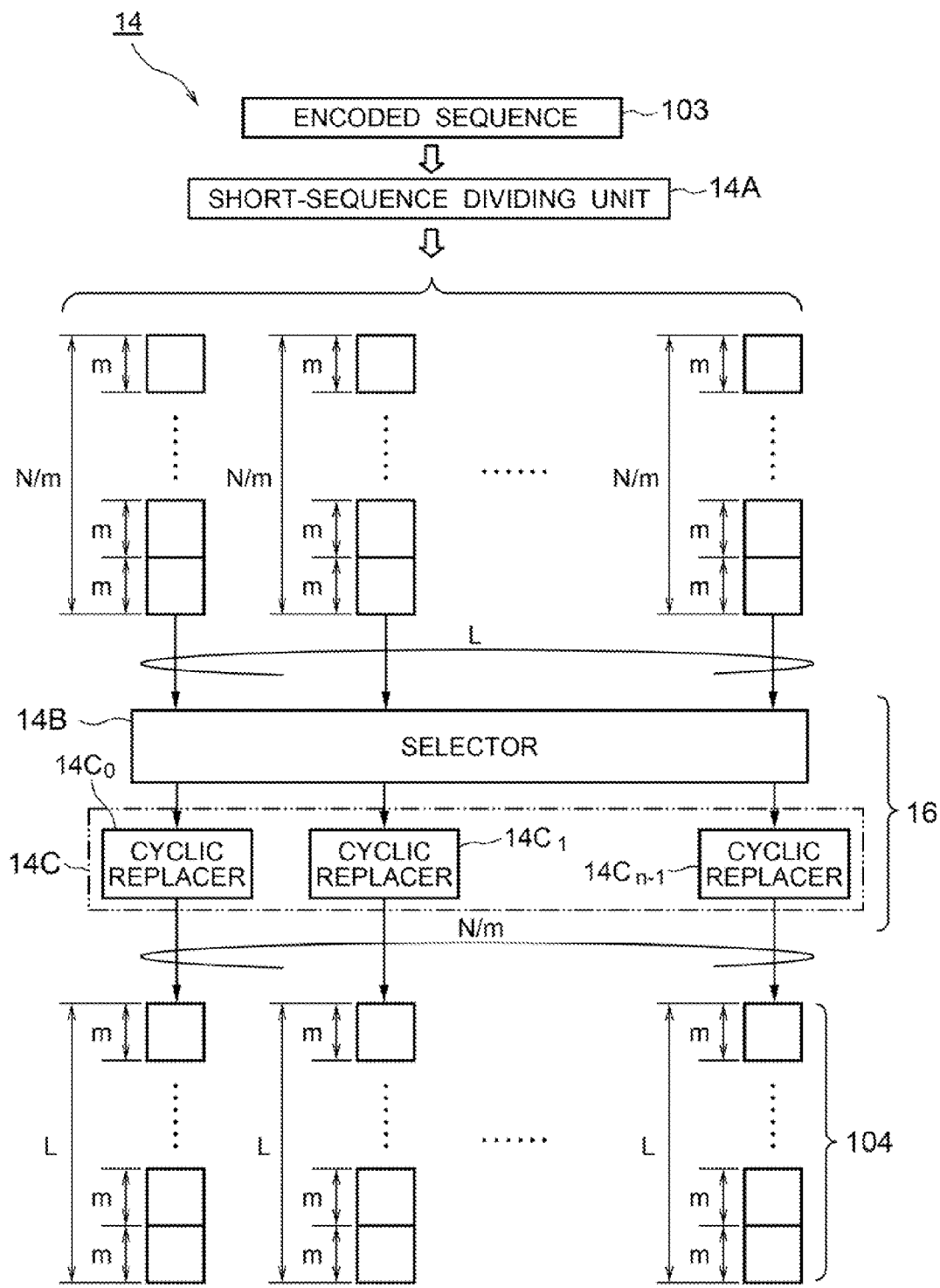
FIG. 3 is a block diagram showing a data replacing module which constitutes a part of the error correction encoding apparatus shown in FIG. 1.

FIG. 3 shows an example of the data replacing module 14.

The data replacing module 14 shown in FIG. 3 is constituted with: a short sequence dividing unit 14A as a replacing data dividing unit which sections (divides into short sequences) each of the L-pieces of input data sequences (L is a natural number) into small blocks of the length m that is same as the stage number m of the quasi-cyclic low density parity check codes; and a data replacing unit 16 which changes the order by a unit of the (L×N)/m-pieces of small blocks of length m set by the division and outputs N/m-pieces of sequences in length of L×m in maximum. The data replacing module 14 is structured so that the above-described cyclic replacement function is executed thereby.

Note here that the replacing data dividing unit (short sequence dividing unit) 14A of the data replacing module 14 has a function which arranges each of L+S-pieces of small blocks constituting a second low density parity check codes so as not to appear on a same row and a same column in a case where the L-pieces of the first low density parity check code sequences among the output data encoded by the first encoding module 12 are divided into the small blocks of length m to be arranged on a higher-order L-row of two dimensional layout of (L+S) rows and (N/m) columns, and the parity sequences of length S×m of the N/m-pieces of the second low density parity check codes are divided into the small blocks of length m and arranged on a lower-order S-row of the two-dimensional layout of the (L+S) rows and (N/m) columns.

The data replacing unit 16 of the data replacing module 14 is constituted with: a selector 14B which performs replacement of the data according to a pattern determined in advance by a unit of the small block sectioned by the replacing data dividing unit 14A; and a cyclic replacing circuit 14C which performs cyclic replacement of an amount determined in advance inside the small block of length m regarding each of the sequences outputted from the selector 14B.

Out of those, the selector 14B includes L-pieces of input ports as well as N-pieces of output ports and has a function of performing distributions. Further, the cyclic replacing circuit 14C includes a plurality of cyclic replacers $14C_1$, $14C_2$, $14C_3$, - - - by corresponding to each sequence so as to be able to execute the cyclic replacement promptly for each sequence thereby.

Further, the input to the selector 14B is the data sequence sectioned into L-pieces of small blocks of length m as the output of the replacing data dividing unit 14A, and the output of the selector 14B is the data sequence of n-pieces of small blocks of length m. Note here that the natural number n is equivalent to a numerical value acquired by dividing the frame length N (N is a natural number) of the m-stage quasi-cyclic low density parity check codes by the stage number m. The regulation of data replacement executed by the selector 14B will be described in details in the section of operations described later.

(Structure of Decoding Apparatus 20)

FIG. 2 shows the decoding apparatus 20 which decodes the data encoded by the encoding method. The decoding apparatus shown in FIG. 2 has a function which decodes the data encoded and transmitted by the error correction encoding apparatus 10 described above, and corrects errors when the errors are attached thereto.

The decoding apparatus 20 includes: a data storage module 21 which includes a plurality of data storage units (RAMs) $21_0$, $21_1$, $21_2$, - - - , $21_{n-1}$ for separately storing a plurality of encoded sequence data 103 processed by the first encoding module 12 of the error correction encoding apparatus 10 and a plurality of encoded sequence data processed by the redundant sequence calculating module 13 of the error correction encoding apparatus 10 out of the data transmitted from the error correction encoding apparatus 10; and a memory controller 20A which controls the storing operations of each of the data storage units (RAMs) $21_0$, $21_1$, $21_2$, - - - , $21_{n-1}$.

Further, the decoding apparatus 20 includes a decoding update processing module 22 provided by corresponding to each of the data storage units (RAMs) $21_0$, $21_1$, $21_2$, - - - , $21_{n-1}$ for repeatedly executing, for the number of times specified by an address generating procedure, an update operation which includes reading out the data stored in the addresses of the data storage units (RAMs) $21_0$, $21_1$, $21_2$, - - -, $21_{n-1}$ according to an address generating procedure set in advance, performing update processing, and storing those to the same addresses of the original data storage modules.

Further, the memory controller 20A has a decoded data output control function which takes out the highest-order bit of each symbol specified by the address generating procedure set in advance by a procedure reversed from the procedure when writing to each of the data storage units (RAMs) $21_0$, $21_1$, $21_2$, - - -, $21_{n-1}$ out of the data held in each of the plurality of the data storage units (RAMs) $21_0$, $21_1$, $21_2$, - - -, $21_{n-1}$ and outputs those as the decoded data.

The data storage module 21 specifically includes N/m-pieces (N is a natural number, and m is the number of stages of quasi-cyclic low density parity check codes) of data storage units (RAMs) $21_0$, $21_1$, $21_2$, - - -, $21_{n-1}$, and each of the data storage units (RAMs) $21_0$, $21_1$, $21_2$, - - -, $21_{n-1}$ is constituted with a RAM (random access memory) whose bit number is b×p (b is a natural number, and p is a submultiple of m) and word number is m/p×(L+S).

The data storage module 21 is specifically constituted with a plurality of RAMs in a number that is same as the quotient acquired by dividing a larger numerical value out of the values of length N and (L+S)×m of the output sequences of each of the first and second encoding modules (low density parity check code encoding modules) shown in FIG. 1 by m described above.

Further, as an initial state, among each of the plurality of the data storage units (RAMs) $21_0$, $21_1$, $21_2$, - - -, $21_{n-1}$, the j-th RAM (j is an integer between 0 and (N/m)−1) of the N/m-pieces is set to hold f(jm+k), f(jm+(m/p)+k), f(jm+2× (m/p)+k), f(jm+(p−1)×(m/p)+k) out of the reception symbol sequences f(0), f(1), - - - f(N−1) corresponding to the i-th sequence among the L-pieces of the sequences encoded with the first low density parity check codes at the "(m/p)×i+k"-th address (i is an integer between 0 and L−1, and k is an integer between 0 and (m/p)−1), and to hold the reception symbol sequence corresponding to the parity sequence encoded with the second low density parity check codes at the addresses after the "(m/p)×L"-th address.

The encoding update processing module 22 is in a structure including: a cyclic shift processing unit 23 constituted with N/m-pieces of cyclic shift circuits $23_0$, $23_1$, $23_2$, - - - which perform cyclic shift of data held in each of the RAMs $21_0$, $21_1$, $21_2$, - - -, $21_{n-1}$ by an amount given by each b-bit; a node processing module 24 constituted with p-pieces of node processing units $24_0$, $24_1$, $24_2$, - - - mounted to respective output sides of each of the cyclic shift circuits $23_0$, $23_1$, $23_2$, - - -; and the data storage module 21 which holds the output results from each of the p-pieces of node processing units $24_0$, $24_1$, $24_2$, - - -. Through cooperative work of each of those structural elements, the update operations are executed.

More specifically, as shown in FIG. 2, the decoding update processing module 22 is in a structure including: the cyclic shift processing unit 23 constituted with N/m-pieces of cyclic shift circuits $23_0$, $23_1$, $23_2$, - - -, $23_{n-1}$ which perform cyclic shift of data held in each of the RAMs $21_0$, $21_1$, $21_2$, - - -, $21_{n-1}$ by an amount given by each b-bit; n-pieces of subtractors 25 which receive outputs of each of the cyclic shift circuits $23_0$, $23_1$, $23_2$, - - -, $23_{n-1}$; a first delay element 26 constituted with a plurality of first delay element units $26_0$, $26_1$, $26_2$, - - -, $26_{n-1}$ for holding the output results of each of the subtractors 25; the node processing module 24 including the p-pieces of node processing units $24_0$, $24_1$, $24_2$, - - -, $24_{p-1}$ which receive each of the outputs from each of the subtractors 25 and perform transmission processing; a second delay element 28 which includes second delay element units $28a$, $28b$, - - - for holding each output result of the node processing module 24 and transmitting those to each of the subtractors 25; and n-pieces of adders 29 which add each of the outputs of the node processing module 24 and the first delay element 26 and transmit the results to each of the RAMs as update information. Through cooperative work of each of those structural elements, the update operations are executed.

Note here that the word number of each of the RAMs is equal to the quotient acquired by dividing the smaller numerical value out of N and (L+S)×m described above by a submultiple p of m described above. Thus, in the explanations hereinafter, it is defined as N≥(L+S)×m for simplifying the descriptions unless there is any specific notice.

As described above, the decoding apparatus 20 includes N/m-pieces of RAMs whose word number is equal to (L+S)× (m/p). Further, the decoding apparatus 20 includes the first delay elements 26, the adders 29, the subtractors 25 in the same number as that of the RAMs, and p-pieces (a submultiple of m) of the second delay elements 28. In the exemplary embodiment shown in FIG. 2, the delay amount of the first delay elements 26 is structured to be equal to the processing delay amount of the node processing module 24. The delay amount of the second delay element 28 will be described in details in the section of explaining the operations later.

Further, while the case of arranging the cyclic shift processing unit 23 at each of the readout ports of each of the data storage units (RAMs) $21_0$, $21_1$, $21_2$, - - -, $21_{n-1}$ in the decoding apparatus 20 has been described, it is also possible to provide a cyclic shift processing unit 33 functioning equivalently with respect to the cyclic shift processing unit 23 at the writing port as shown in FIG. 2.

Regarding the cyclic shift processing units 23 and 33, either the readout port side or the writing port side can share the other side, so that both the readout port and the writing port may not necessarily have to be provided but either one of those may be provided. In the section of explaining the operations later, a case of having the both will be described for simplifying the explanations.

Figure 6:
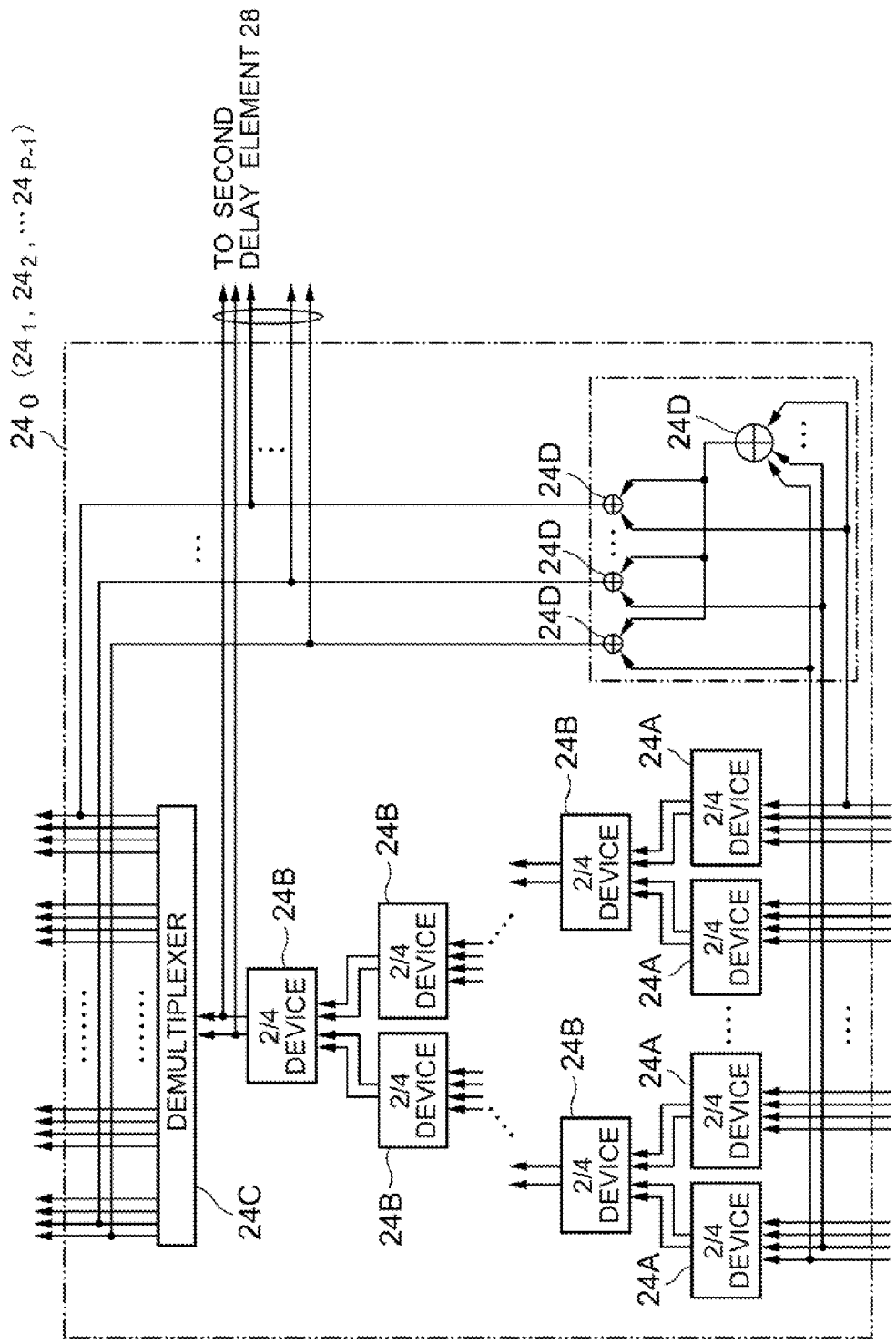
FIG. 6 is a block diagram showing an example of a node processing module (minimum-value calculating module) which constitutes a part of the decoding apparatus shown in FIG. 1.

FIG. 6 shows an example of the node processing module 24 which constitutes a part of the decoding apparatus 20. FIG. 6 shows such a characteristic feature that each of the p-pieces of node processing units $24_0$, $24_1$, $24_2$, - - -, $24_{p-1}$ constituting the node processing module 24 is formed by a minimum-value calculating module.

Among those, the minimum-value calculating module (node processing unit) $24_0$ includes: a plurality of 2/4 data processing units 24A provided at the data input stage thereof for receiving output data from each of the subtractors 25 by sectioning those into groups of four pieces each, and outputting two numerical values whose absolute values are small and a numerical value whose absolute value is minimum along with the numbers of the corresponding input ports; and a plurality of 2/4 data processing units 24B having the same function, which are provided on the output side of the plurality of each of the 2/4 data processing units 24A in a sequential tournament manner.

Those will be described in more details.

As described above, the minimum-value calculating module (node processing unit) $24_0$ shown in FIG. 6 is constituted by including the 2/4 data processing units 24A, 24B connected in a tournament manner, a demultiplexer 27C, and an exclusive OR circuit 24D. Among those, the 2/4 data processing units 24A, 24B are structured to input four integers, and to output the two smaller values among those and the input port number to which the smallest value is inputted, as described above.

The input data to the 2/4 data processing units 24A in the tournament lowermost stage (input stage) is the absolute value of the input data of the minimum-value calculating module (node processing unit) $24_0$ and 1 bit showing a code of plus/minus is inputted to the exclusive OR circuit 24D. The outputs of the 2/4 data processing units 24B in the uppermost stage of the tournament are the minimum value X0, second lowest smallest value X1 among the absolute values of all the input data to the minimum-value calculating module (node processing unit) $24_1$, and number P of the input port to which the minimum value is inputted.

This is the same for the other minimum-value calculating modules (node processing units) $24_1$, $24_2$, $24_3$, - - - , $24_{p-1}$.

Thereby, the function of outputting the number corresponding to the input port of the numerical value whose absolute value is the minimum among the input numerical values of k-pieces of input data is executed. Based on this, all the exclusive ORs of the highest bits of (k−1) pieces selected from the entire highest bits of the k-pieces of input numerical values are calculated.

Further, referring to FIG. 6, the demultiplexer 24C inputs the output of the 2/4 data processing unit 24B of the uppermost stage of the tournament, outputs X1 to the output port of the same number as the input port number P, and outputs X0 to the output ports of the other numbers. As each output of the minimum-value calculating modules $24_0$, $24_1$, $24_2$, - - - , a code bit (1-bit) is added to the output of the demultiplexer 24C as the structural element according to the output result of the exclusive OR circuit 24D to be outputted.

In the meantime, the minimum-value calculating modules $2424_0$, $24_1$, $24_2$, - - - also output the input data to the second delay element 28 of the decoding apparatus 20 shown in FIG. 2 in addition to the output described above. The output data to the second delay element 28 is X0, X1, P which are the outputs of the 2/4 data processing units 24B of the uppermost stage of the tournament and each output bit of the exclusive OR circuit 24D.

(Operation Explanation 1: Encoding Apparatus)

First, the operations of the encoding apparatus 10 shown in FIG. 1 will be described.

First, the operations include: a short sequence dividing step (step S501) which divides the transmission data sequence into L-pieces of short sequences by the data dividing module 11; a first encoding step (step S502) which encodes each of the divided L-pieces of short sequences into encoded sequences of length N by the m-stage cyclic low density parity check encoding method (L, m are natural numbers, and N is a multiple of m) by using the first encoding module 12; and a redundant sequence generation/output step (step S503) which generates the redundant sequence by the redundant sequence output module 13 based on each of the encoded sequences of length N outputted from the first encoding module 12, and outputs it as the redundant sequence data along with a plurality of encoded sequences outputted from the first encoding module 12.

At the time of outputting the redundant sequence data (step S503), there is executed a step (step S503-(1)) which inputs the L-pieces of decoded sequences of length N encoded by the first encoding module 12 to the data replacing module 14 and outputs those by changing the order of each data sequence. Thereafter, there is executed a step (step S503-(2)) which performs encoding (error correction encoding) on each of the replaced and outputted encoded sequences by the m-stage cyclic low density parity check encoding method by using the second encoding module 15.

In the step (step S503-(1)) executed by the data replacing module 14 to change the order of the data sequences with respect to the input data and output those, the short sequence dividing unit 14A executes a step which divides (sections into small blocks) each of the L-pieces of data sequences encoded by the first encoding module 12 into the short sequences of length m in the same number as the stage number in of the first quasi-cyclic low density parity check codes, and the data replacing unit 16 executes a step (step S503-(1)b) which changes the order by a unit of the (L×N)/m-pieces of short sequences of length m set by this dividing operation and outputs the N/m-pieces of sequence of length L×m at the maximum.

Further, in the step (step S503-1(b)) executed by the data replacing unit 16 for changing the order by a unit of short sequence, the selector 14B including the L-pieces of input ports and the N-pieces of output ports executes the distributing step, and the cyclic replacing circuit 14C constituted with a plurality of cyclic replacers executes the step which performs cyclic replacement of each of the small blocks outputted thereby. Through this procedure, the N/m-pieces of sequences of length L×m at the maximum are outputted.

This will be described in more details.

As described above, the encoding apparatus 10 first fetches the transmission data sequence 101 of length K, and divides it into the L-pieces of short sequences of lengths $K_0$, $K_1$, - - - , $K_{L-1}$ ($K_0$, $K_1$, - - - , $K_{L-1}$ and L are natural numbers) by the data dividing unit 11. Then, each of the divided L-pieces of transmission data short sequences 102 is encoded by the first encoding module 12 which includes the corresponding L-pieces of encoding processing units $12_0$, $12_1$, - - - , $12_{L-1}$.

That is, the first encoding module 12 as the m-stage low density parity check encoding module shown in FIG. 1 encodes each of the sequences that are acquired by dividing each transmission data sequence of length K described above into L-pieces (L is a natural number) as the sequences of length N.

Then, the L-pieces of the encoded sequences 103 of length N are outputted to the first encoding module 12 and inputted to the data replacing module 14 as shown in FIG. 1.

The data replacing module 14 replaces the L-pieces of encoded sequences 103 of length N into the data sequences 104 of length equal to or less than L×m, and outputs n-pieces of the data sequences 104 at the maximum (n is a value acquired by dividing N by m). Subsequently, each of the data sequences 104 of length equal to or less than L×m is encoded by the second encoding module (m-stage quasi-cyclic low density parity check encoding module) 15, and the redundant encoded sequences acquired thereby are calculated and outputted.

Parity sequences of length S×m (S is a natural number) acquired by excluding the input sequences to the second encoding module 15 from the encoded sequences are outputted for the same number (n-pieces at the maximum) as that of the output sequences of the data replacing module 14.

This will be described in more details.

The data replacing, module 14 shown in FIG. 3 inputs the L-pieces of the sequences of length N as described above. Note here that the L-pieces of data sequences 103 shown in FIG. 3 are defined as an input sequence 0, an input sequence 1, - - - , an input sequence L−1 from the left side for convenience' sake.

Then, each of the inputted data sequences 103 is divided into small blocks of length m in the same number as the stage number m by the replacing dividing unit 14A, and outputted to the selector 14B of the data replacing unit 16 as the sequence data constituted with the n-pieces of small blocks of length m (n is a value acquired by dividing N by m). The selector 14B includes the L-pieces of input ports and n-pieces of output ports. Assuming that each of those input and output ports are numbered as 0, 1, 2, - - - from the left side for convenience' sake, the input sequence 0 is inputted to the input port 0, and the input sequence 1 is inputted to the input port 1 (this is the same for the cases thereafter).

Input to the selector 14b is done by a unit of small block. Each of the L-pieces of the small blocks inputted from the L-pieces of input ports is distributed to one of the n-pieces of outputs ports or discarded. The number of small blocks outputted from each of the output ports is "L" at the maximum. Distribution of the small blocks to the output ports inputted from the selector 14B is so set that the input ports of each of the small blocks outputted from the same output port become all different.

That is, the L-pieces of small blocks at the maximum are outputted from the output port X of the selector 14B (X is an integer between 0 and n−1). Provided that the number of small blocks inputted from the input port Y among the small blocks is T (X, Y), all the integers Y between 0 and L−1 are so set that T(X, Y) becomes equal to or less than 1.

Each small block outputted from the output ports of the selector 14B is correspondingly processed and cyclic-replaced by the cyclic replacing unit 14C by each data sequence to be the output of the data replacing module 14.

Figure 4:
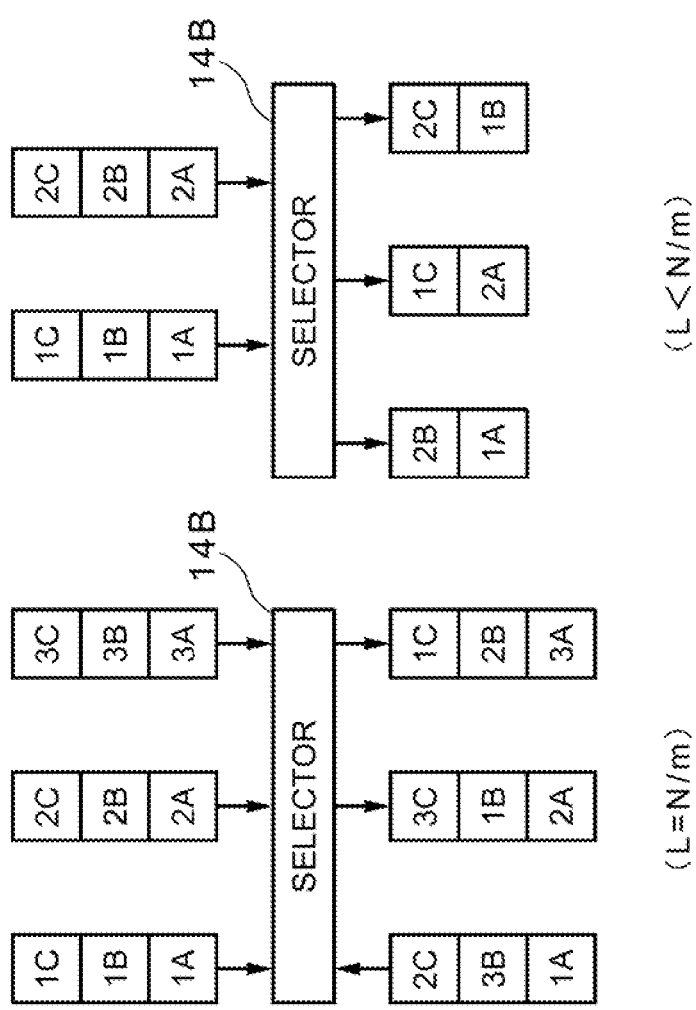
FIG. 4 is an explanatory illustration showing an operation example of a data replacing module shown in FIG. 3.

FIG. 4 shows examples of operations of the selector 14A which forms a part of the replacement/output processing unit 16 of the data replacing module 14 described above. In the examples of operations of the selector 14A shown in FIG. 4, FIG. 4A is a case where the input port number L is equal to the output port number n (=N/m), FIG. 4B is a case where the input port number L is smaller than the output port number n, and FIG. 4C is a case where the input port number L is larger than the output port number n.

In all the cases, the input ports of each of the small blocks outputted from the same output port are set to be all different. Particularly, FIG. 4C shows a case where a part of the input small blocks does not appear in any of the output ports but is discarded.

Figure 5:
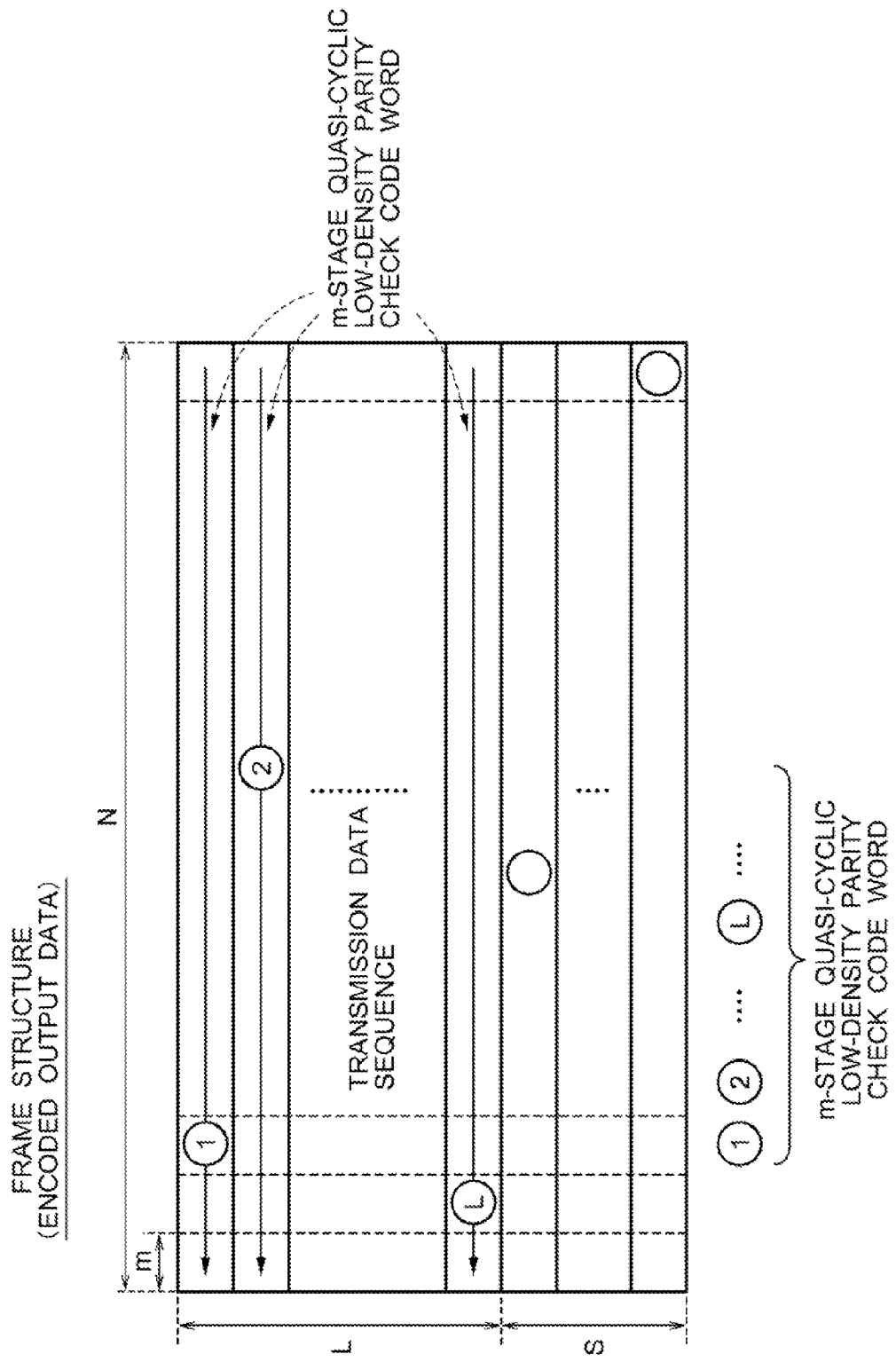
FIG. 5 is an explanatory illustration showing a frame structure of an encoded data sequence outputted from the error correction encoding apparatus shown in FIG. 1.

FIG. 5 shows an example of a frame structure as the output data of the encoding apparatus 10.

In FIG. 5, the n-pieces of small blocks of length m arranged on the upper-stage L row in a horizontal direction form a symbol which constitutes an code word of the m-stage low density parity check codes of the first encoding module 12 shown in FIG. 1. In the meantime, each of the "L+S"-pieces of small blocks constituting the code words of the m-stage low density parity check codes of the second encoding module 15 shown in FIG. 1 is replaced and arranged by the data replacing module 14 so as not to appear on the same row and same column.

(Operation Explanation 2: Decoding Apparatus)

In FIG. 5 described above, an example of the frame structure of the output data of the error correction encoding apparatus 10 is presented. A noise is added to the data of the frame structure shown in FIG. 5 while the data is being transmitted via a communication path, and the data with the noise is inputted to the decoding apparatus 20 as reception data via a demodulator and the like.

The decoding apparatus 20 operates to decode the data encoded and transmitted by the error correction encoding apparatus 10 and to correct the error when the error is added thereto.

In that case, first, among the data transmitted from the error correction encoding apparatus 10, the data of a plurality of encoded sequences processed by the first encoding module 12 provided to the error correction encoding apparatus 10 and the data of a plurality of encoded sequences processed by the redundant sequence calculating module 13 are separately stored to the data storage module 21 that is formed by a plurality of storing units (step S601).

Subsequently, the decoding update processing module 22 that is provided by corresponding to each of the data storage units 21 repeatedly executes, for the number of times specified by the address generating procedure, an update operation which reads out the data held at the addresses of each of the data storage units according to the address generating procedure set in advance, performing update processing, and stores the data to the same addresses in the original data storage modules (step S602).

The memory controller 20A executes a decoded data output control step which, among the data held to each of a plurality of data storage units (RAMs) $21_0$, $21_1$, $21_2$, - - - , $21_{n-1}$, takes out the highest-order bits of each symbol specified by the address generating procedure set in advance in a reversed order from that of the time where those are written to each of the data storage modules and outputs those as the decoded data (step S603).

This will be described in more details hereinafter.

As shown in FIG. 2, the decoding apparatus 20 includes the data storage module 21 which includes the n (=N/m)-pieces of random access memories (RAMs: data storage units) $21_0$, $21_1$, $21_2$, - - - , $21_{n-1}$, and stores the reception data described above to the data storage units $21_0$, $21_1$, $21_2$, - - - , $21_{n-1}$ in a following manner.

Figure 7:
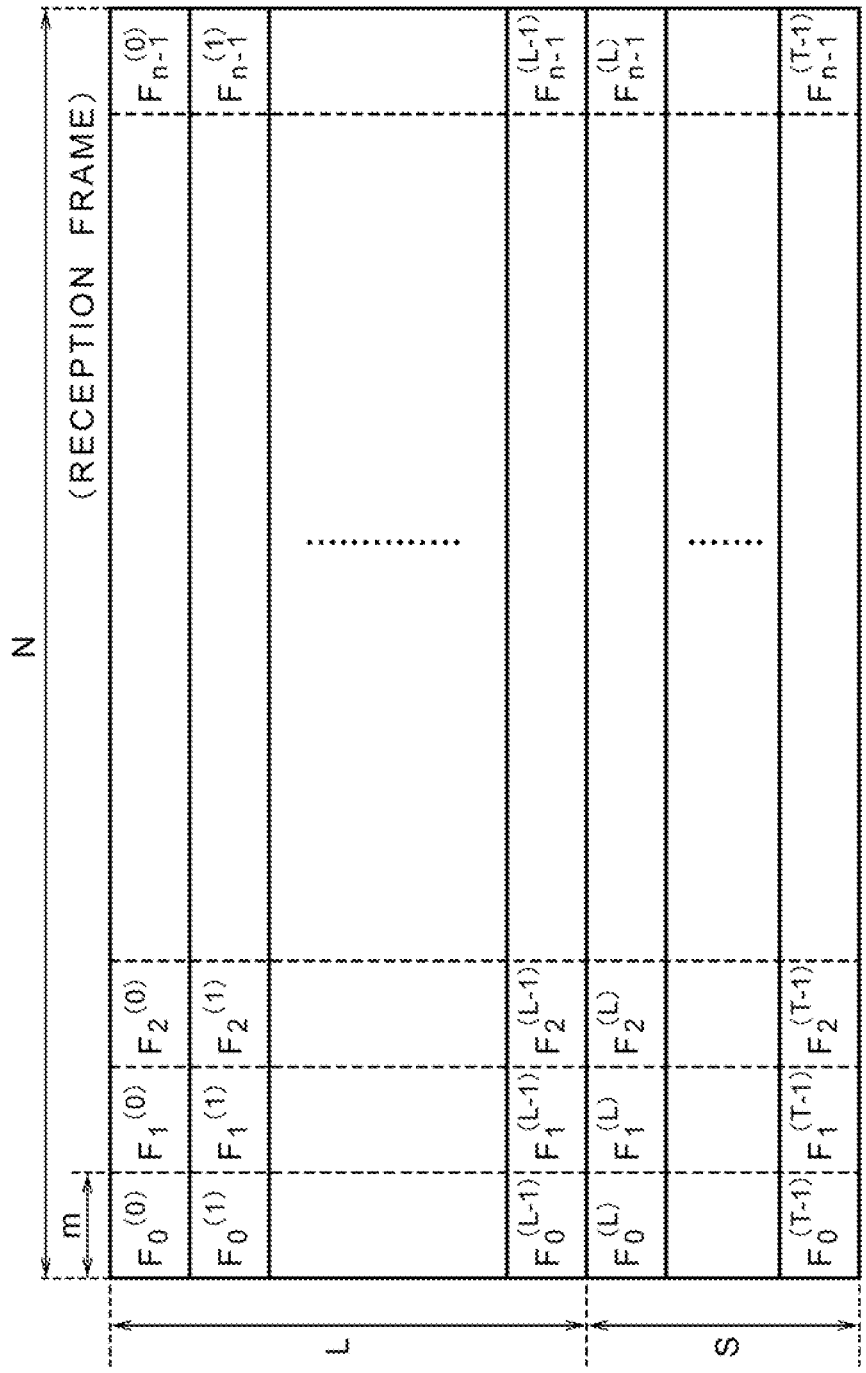
FIG. 7 is an explanatory illustration showing a frame structure of a reception frame sectioned by each m-symbol corresponding to the frame structure of the data sequence shown in FIG. 5.

First, the reception data is sectioned by each symbol of length in as in FIG. 7 by corresponding to the frame structure of FIG. 5, and each of those is expressed as $F_j^{(i)}$ (i is an integer between 0 and T−1, T is L+S described above, and j is an integer between 0 and n−1).

The symbol $F_j^{(i)}$ is constituted with m-pieces of symbols $f_j^{(i)}(0)$, $f_j^{(i)}(1)$, - - - , $f_j^{(i)}(m-1)$, and each symbol shows b-bit data (b is a natural number).

Provided that the n-pieces of RAMs $21_0$, $21_1$, - - - are numbered with integers of 0 to n−1, p-pieces of data $f_j^{(i)}(k)$, $f_j^{(i)}((m/p)+k)$, - - - , $f_j^{(i)}(2\times(m/p)+k)$, - - - , $f_j^{(i)}((p-1)\times(m/p)+k)$ are stored at the addresses of the "(m/p)×i+k"-th address of the j-th RAM (i is an integer between 0 and T−1, k is an integer between 0 and (m/p)−1).

The decoding apparatus 20 shown in FIG. 2 stores the reception data to the n-pieces of RAMs $21_0$, $21_1$, - - - , and starts the decoding processing in a state where each of the delay elements 26, 28 are initialized to "0".

First, the data is read out from the n-pieces of RAMs $21_0$, $21_1$, - - - . Then, the readout addresses thereof are generated in a following manner.

Note here that the check matrix of the L-pieces of first encoding modules (m-stage quasi-cyclic low density parity check encoding modules) 12 shown in FIG. 1 is defined as a following Expression 2.

$$H^{(i)} = \begin{bmatrix} I_{0,0}^{(i)} & I_{0,1}^{(i)} & \dots & I_{0,n-1}^{(i)} \\ I_{1,0}^{(i)} & I_{1,1}^{(i)} & \dots & I_{1,n-1}^{(i)} \\ \dots & \dots & \dots & \dots \\ I_{r_i-1,0}^{(i)} & I_{r_i-1,1}^{(i)} & \dots & I_{r_i-1,n-1}^{(i)} \end{bmatrix} \quad \text{[Expression 2]}$$

The symbol i is an integer between 0 and L−1. Further, in order to simplify the description, regarding the integers i between 0 and L−1, row vector numbers $r_i$ on the matrix $H_{(i)}$ of Expression 2 are assumed to be same natural number r.

The decoding processing is basically the same even when the row vector numbers vary depending on each of the integers i, except that the processing time (clock) required for the processing is different.

Now, assuming that a symbol $h_{k,j}^{(i)}$ is an integer "$0 \le h_{k,j}^{(i)} < m$" showing a non-zero component position of a first row vector of m×m cyclic replacement matrix $I_{k,j}^{(i)}$ that is a (k, j) component regarding the check matrix of Expression 2, the j-th random access memory readout address value "$A^{(0)}(j, t)$" at the time parameter from t=0 to t=(m/p)×L−1 can be calculated by a following Expression 3 (j is an integer between 0 and n−1).

$$A^{(0)}(j,t)=[t/(m/p)] \times (m/p) + ((h_{0,j}^{([t/(m/p)])} + t) \bmod (m/p)) \quad \text{[Expression 3]}$$

Note here that "t/(m/p) shows the quotient acquired by dividing t by (m/p). Then, the time parameter t is reset, and the j-th random access memory readout address value "$A^{(1)}(j, t)$" from the next time parameter t=0 to t=(m/p)×L−1 is calculated by a following Expression 4.

$$A^{(1)}(j,t)=[t/(m/p)] \times (m/p) + ((h_{1,j}^{([t/(m/p)])} + t) \bmod (m/p)) \quad \text{[Expression 4]}$$

Thereafter, while generally assuming that the time parameter is t, the j-th random access memory readout address values "$A^{(k)}(j, t)$" from the time parameter t=0 to t=(m/p)×L−1 are calculated by a following Expression 5 (k is an integer between 0 and r−1) in the same manner.

$$A^{(k)}(j,t)=[t/(m/p)] \times (m/p) + ((h_{k,j}^{([t/(m/p)])} + t) \bmod (m/p)) \quad \text{[Expression 5]}$$

The readout address values "$A^{(k)}(j, t)$" are calculated by using Expression 5 from Expression 2 which shows the check matrix of the quasi-cyclic low density parity check codes of the first encoding module 12 described above. That is, the data is read out sequentially from the n-pieces of RAMs $21_0$, $21_1$, $21_2$, - - - , $21_{n-1}$ according to the address values $A^{(0)}(j, t)$, $A^{(1)}(j, t)$, - - - , $A^{(r-1)}(j, t)$. In that case, it takes time of (m/p)×L×r in total.

Next, described is a method for calculating the readout address value by using Expression 6 which shows the check matrix of the n-pieces of quasi-cyclic low density parity check codes of the second encoding module 15 shown in FIG. 1. As in the case of Expression 2, it is defined to be natural number 1 regardless of the row block numbers i (i is an integer between 0 and n−1) for simplifying the explanations.

$$H^{(i)} = \begin{bmatrix} I_{0,0}^{(i)} & I_{0,1}^{(i)} & \cdots & I_{0,L+S-1}^{(i)} \\ I_{1,0}^{(i)} & I_{1,1}^{(i)} & \cdots & I_{1,L+S-1}^{(i)} \\ \cdots & \cdots & \cdots & \cdots \\ I_{r_i-1,0}^{(i)} & I_{r_i-1,1}^{(i)} & \cdots & I_{r_i-1,L+S-1}^{(i)} \end{bmatrix} \quad \text{[Expression 6]}$$

In the example of the frame structure shown in FIG. 5, it is so defined that the "$R^{(i)}(0)$, $R_1^{(i)}(1)$, - - - , $R^{(i)}(L+S-1)$"-th small blocks from the left form the i-th low density parity check code word (i is an integer between 0 and n−1) within the n-pieces of quasi-cyclic low density parity check codes of the second encoding module 15 shown in FIG. 1.

As shown in the structure disclosed in FIG. 3 (the data replacing module 14) and FIG. 4 (operation of the corrector) described above, $R^{(i)}(a) \ne R^{(i)}(b)$ applies for different integers a and b between 0 and L+S−1.

Then, by taking the step of (m/p)×L×r, the address values are calculated sequentially by using Expression 5. Thereafter, the time parameter t is reset, and the j-th random access memory readout address values "$B^{(k)}(j, t)$" from the time parameter t=0 to t=(m/p)×n−1 are calculated by a following Expression 7.

$$B^{(k)}(j,t)=\phi(j,t) \times (m/p) + ((h_{k,\phi(j,t)}^{([t/(m/p)])} + t) \bmod (m/p)) \quad \text{[Expression 7]}$$

Note here that the symbol k is an integer between 0 and 1−0, and ψ(j, t) is an inverse function of $R^{([t/(m/p)])}(j)$ which is an integer between 0 and L+S−1 satisfying a following Expression 8.

$$j = R^{([t/(m/p)])}(\phi(j,t)) \quad \text{[Expression 8]}$$

As described above, the address values are calculated according to $A^{(0)}(j, t)$, $A^{(1)}(j, t)$, - - - , $A^{(r-1)}(j, t)$, and the address values are calculated according to $B^{(0)}(j, t)$, $B^{(1)}(j, t)$, - - - , $B^{(r-1)}(j, t)$. Note here that the order for calculating the addresses is not necessarily in this order. The addresses $B^{(0)}(j, t)$, $B^{(1)}(j, t)$, - - - , $B^{(r-1)}(j, t)$ may be calculated first.

As described above, the data is read out sequentially from the random access memories (RAMs) $21_0$, $21_1$, $21_2$, - - - , $21_{n-1}$ by taking "(m/p)×L×r+(m/p)×n×1" steps in total as one cycle.

Figure 8:
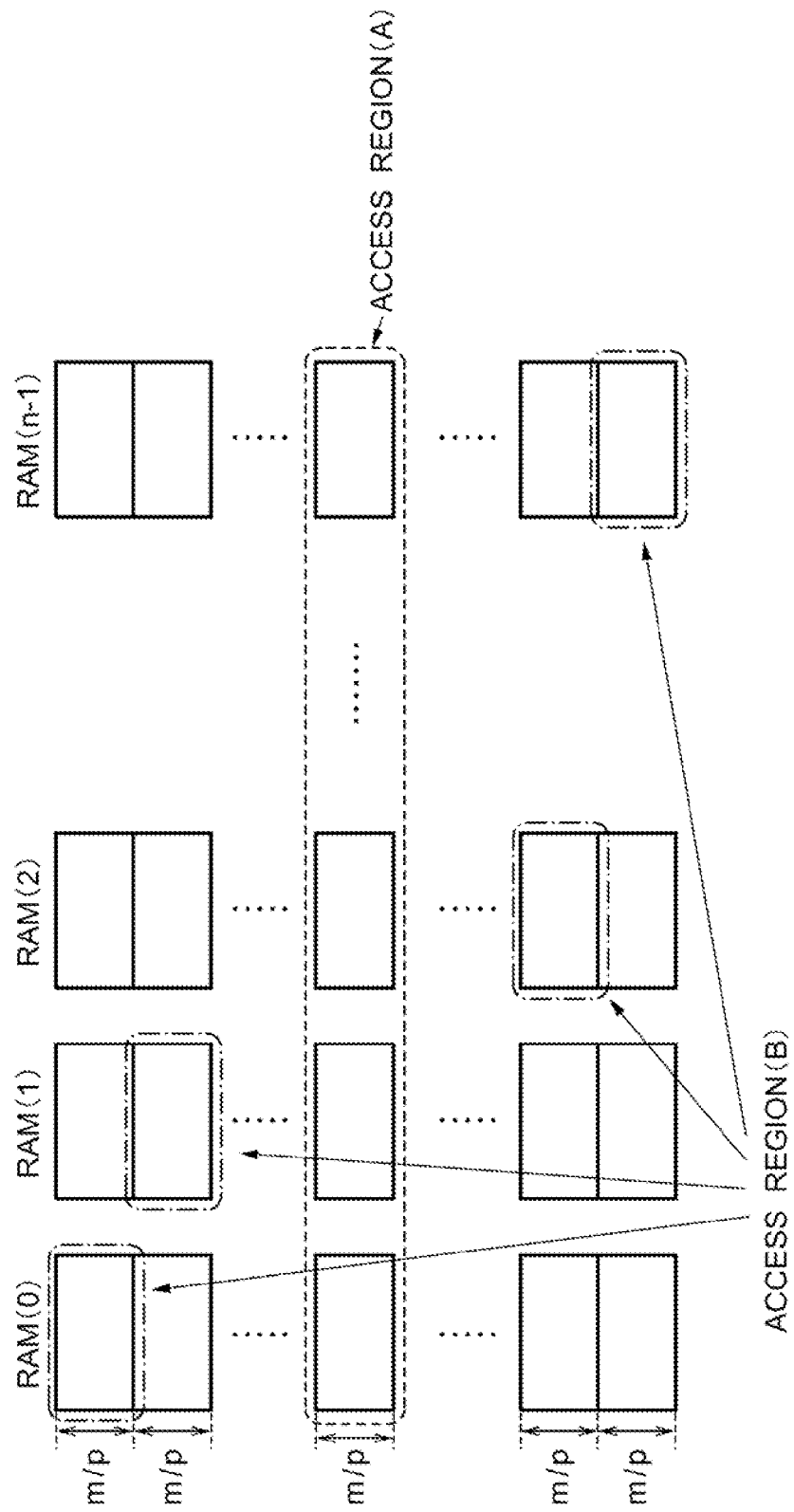
FIG. 8 is an illustration showing an example of a method of making access to a plurality of RAMs by a memory controller in the decoding apparatus shown in FIG. 2, in which region (A) is a case where accesses are made according to address values calculated by Expression 5 and region (B) is a case calculated by Expression 7.

FIG. 8 shows a difference between the access methods of Expression 5 and Expression 7.

When the address values of each of the n-pieces of RAMs $21_0$, $21_1$, $21_2$, - - - , $24_{n-1}$ are divided into sections of length m/p such as 0 to (m/p)−1, m/p to (m/p)−1, - - - , the regions accessed according to the address values calculated by Expression 5 are the same sections in all the random access memories (RAMs) $21_0$, $21_1$, $21_2$, - - - , $21_{n-1}$ (see access region (A) in FIG. 6).

In the meantime, the regions accessed according to the address values calculated by Expression 7 are sections different from each other (see access regions B in FIG. 6). The regions accessed according to the address values of Expression 7 are defined by the data replacing module 14 of FIG. 3 described above. Thus, in other words, it is important to specify in advance the functional content of the data replacing module 14 shown in FIG. 3 so that the regions accessed according to the address values calculated by Expression 7 become sections different from each other.

The data read out from the RAMs $21_0$, $21_1$, $21_2$, - - - , $21_{n-1}$ by the procedures described above are inputted to the cyclic shift processing unit 23 that is constituted with the cyclic shift circuits $23_0$, $23_1$, $23_2$, - - - , $23_{n-1}$.

As described, the bit length of the RAMs $21_0$, $21_1$, $21_2$, - - - , $21_{n-1}$ corresponds to the p symbol (b×p bit), and the cyclic shift processing unit 23 performs cyclic shift on the data of the p symbol by each symbol for the shift amount set in advance. The shift amount is determined by being related to the readout address, and the shift amount regarding the data read out at the address value $A^{(k)}(j, t)$ calculated by Expression 5 is calculated by following Expression 9.

$$[h_{k,j}^{([t/(m/p)])}/(m/p)] \text{ in a case of } t \bmod (m/p) < (m/p) - (h_{k,j}^{([t/(m/p)])} \bmod (m/p)) \text{ } [h_{k,j}^{([t/(m/p)])}/(m/p)]+1 \text{ in cases other than the above case} \quad \text{[Expression 9]}$$

Similarly, the shift amount regarding the data read out at the address value $B^{(k)}(j, t)$ calculated by Expression 7 is calculated by following Expression 10.

$$[h_{k,\phi(j,t)}^{([t/(m/p)])}/(m/p)] \text{ in a case of } t \bmod (m/p) < (m/p) - (h_{k,\phi(j,t)}^{([t/(m/p)])} \bmod (m/p)) \text{ } [h_{k,\phi(j,t)}^{([t/(m/p)])}/(m/p)]+1 \text{ in cases other than the above case} \quad \text{[Expression 10]}$$

Figure 9:
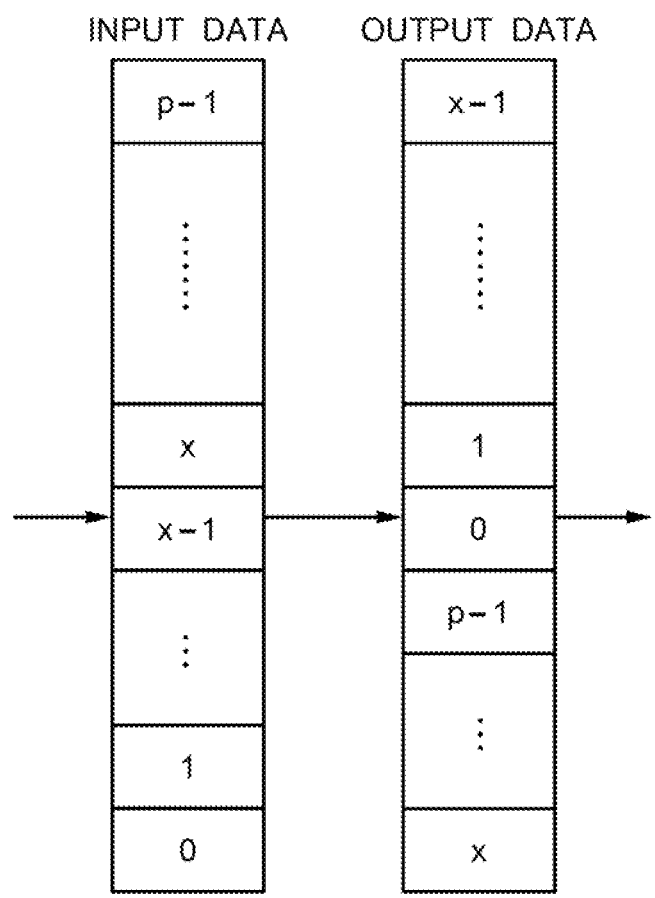
FIG. 9 is an explanatory illustration showing an example of operations of a cyclic shift processing unit of the decoding apparatus shown in FIG. 2.

FIG. 9 shows an example of the operations of the cyclic shift processing unit 23 described above. In FIG. 7, a data sequence cyclic-shifted from the data sequence of p-symbol by x-pieces (x is an integer between 0 and p−1) towards the lower direction of FIG. 7 is outputted.

The data read out from the n-pieces of RAMs $21_0$, $21_1$, $21_2$, ---, $21_{n-1}$ by Expression 5 and Expression 7 are cyclic-shifted by the amount depicted in Expression 9 and Expression 10, the output data of the second delay element 28 including the delay element units 28a, 28b, --- is subtracted therefrom, and the results thereof are inputted to the first delay element 26 including the delay element units $26_0$, $26_1$, ---, $26_{n-1}$ and the node processing module 24 including the p-pieces of node processing units $24_0$, $24_1$, $24_2$, ---, $24_{p-1}$, respectively.

In that case, the initial value of the data of the first delay element 26 is set to 0, so that 0 is subtracted in a first cycle (no change). The decoding apparatus 20 shown in FIG. 2 includes the node processing module 24 which includes the p-pieces of node processing units $24_0$, $24_1$, $24_2$, ---, $24_{p-1}$. The decoding apparatus 20 divides the data of the p-symbol originated from the RAMs $21_0$, $21_1$, $21_2$, ---, $21_{n-1}$ into p-pieces by a unit of symbol, and inputs each data to each of the p-pieces of node processing units $24_0$, $24_1$, $24_2$, ---, $24_{p-1}$.

Each of the node processing units $24_0$, $24_1$, $24_2$, ---, $24_{p-1}$ of the node processing module 24 inputs the data of one symbol (n symbols in total) out of the data originated from the n-pieces of the RAMs $21_0$, $21_1$, $21_2$, ---, $21_{n-1}$.

The minimum-value calculating module disclosed in FIG. 3 in this exemplary embodiment constitutes each of the node processing units $24_0$, $24_1$, $24_2$, ---, $24_{p-1}$ of the node processing module 24. The minimum-value calculating modules (node processing units) $24_0$, $24_1$, $24_2$, ---, $24_{p-1}$ have a function of inputting n-pieces of symbols $Y_0$, $Y_1$, ---, $Y_{n-1}$ and outputting $(-1)^{q_0}X_0$, $(-1)^{q_1}X_1$, ---, $(-1)^{q_{n-1}}X_{n-1}$.

Note here that $q_i$ and $X_i$ are calculated by following Expression 11 and Expression 12.

$$q_i = \bigoplus_{j \neq i} s(Y_j) \qquad \text{[Expression 11]}$$

$$X_i = \min_{j \neq i} |Y_j| \qquad \text{[Expression 12]}$$

Note here that s(Y) is defined as 1 when Y<0 and as 0 when Y≥0. Further, symbol = shows an exclusive OR. Each of the outputs of the minimum-value calculating modules (node processing units) $24_0$, $24_1$, $24_2$, ---, $24_{p-1}$ are $(-1)^{q_0}X_0$, $(-1)^{q_1}X_1$, ---, $(-1)^{q_{n-1}}X_{n-1}$, respectively. These are added to the data that have gone through each of the delay element units $26_0$, $26_1$, $26_2$, ---, $26_{n-1}$ of the first delay element 26 and written to the corresponding RAMs $21_0$, $21_1$, $21_2$, ---, $21_{n-1}$ via the corresponding cyclic shift circuits $33_0$, $33_1$, $33_2$, ---.

Note here that the shift amount of the cyclic shift processing unit 33 offsets the shift amount of the cyclic shift processing unit 23 used at the time of readout. That is, in a case where the cyclic-shift of x-pieces is performed in the lower direction by the cyclic shift processing unit 23 used at the time of readout (see FIG. 7), the cyclic shift processing unit 33 performs cyclic shift of x-pieces in the upper direction (cyclic shift of p−x pieces in the lower direction).

When writing the data that has gone through the cyclic shift processing unit 33 to the RAMs $21_0$, $21_1$, $21_2$, ---, $21_{n-1}$, the data are written to the same addresses as the readout addresses calculated by Expression 5 and Expression 7 described above.

The output data of the node processing module 24 is not only added to the output data of each of the delay element units $26_0$, $26_1$, $26_2$, ---, $26_{n-1}$ of the first delay element 26 but also inputted to each of the delay element units of the second delay element 28.

When the minimum-value calculating modules are used as each of the node processing units $24_0$, $24_1$, $24_2$, ---, $24_{p-1}$ of the node processing module 24, the storage capacitance used in the delay element can be effectively reduced through inputting X0, X1, P and each of the output bits of the exclusive OR as disclosed in the section of the structure described above instead of inputting the output data $(-1)^{q_0}X_0$, $(-1)^{q_1}X_1$, ---, $(-1)^{q_{n-1}}X_{n-1}$ directly as they are to the second delay element 28.

Therefore, when the minimum-value calculating modules (see FIG. 6) are used as each of the node processing units $24_0$, $24_1$, $24_2$, ---, $24_{p-1}$ of the node processing module 24 as disclosed in FIG. 6, X0, X1, P and each of the output bits of the exclusive OR circuit 24D are to be inputted to the second delay element 28 shown in FIG. 2. In that case, on the output side of the second delay element 28, it is necessary to provide a device which generates the output data $(-1)^{q_0}X_0$, $(-1)^{q_1}X_1$, ---, $(-1)^{q_{n-1}}X_{n-1}$ from X0, X1, P and each of the output bits of the exclusive OR circuit 24D before making input to each of the subtractors 25.

As described, the data read out from the n-pieces of RAMs $21_0$, $21_1$, $21_2$, ---, $21_{n-1}$ according to the address generating procedures shown in Expression 5 and Expression 7 are updated via the node processing module 24, and stored again to the same addresses of the RAMs $21_0$, $21_1$, $21_2$, ---, $21_{n-1}$. At a stage where the update processing described above is executed over all the addresses shown in Expression 5 and Expression 7, one-time encoding processing (for one period) is completed.

In that case, at least steps of "(m/p)×L×r+(m/p)×n×1" times are required for one-time decoding processing. For the second-time decoding processing, the data are read out from the RAMs $21_0$, $21_1$, $21_2$, ---, $21_{n-1}$ according to the address generating procedures shown in Expression 5 and Expression 7, updated, and written through completely the same procedure as that of the first time. The processing of the third time and thereafter is also completely the same. After repeating the steps for a prescribed number of times set in advance, the highest-order bits of each of the symbols held inside the RAMs $21_0$, $21_1$, $21_2$, ---, $21_{n-1}$ are taken out and outputted (in a reversed procedure from the time of writing the reception data to the random access memories). The output data are the results of decoding.

The delay amount of the second delay element 28 corresponds to the number of steps required for one-time repeated decoding processing. Thus, while the input on the second delay element 28 side of the subtractor 25 is 0 at the time of one-time decoding processing, the input on the second delay element 28 side of the subtractor 25 is the data outputted from the node processing module 24 in the decoding processing executed right before for the second-time decoding processing and thereafter.

The functions of each of the structural elements described above and the response operations between each of the structural elements may be put into executable programs to be executed by a computer. The programs are recorded on recording media and handled as subjects of commercial dealings.

As described, the first exemplary embodiment is structured to: divide the transmission data sequence into L-pieces of short sequences; encode each of the L-pieces of short sequences by the m-stage quasi-cyclic low density parity check encoding method and output those; divide each of the L-pieces of the encoded sequences into short sequences of length m in the same number as the stage number in of the quasi-cyclic codes; change the order by using the data replacing module 14; and further encode the sequences by the m-stage quasi-cyclic low density parity check encoding method. This makes it possible to perform efficient decoding processing of the codes with large frame length and large encoding gain by using the simple-structured decoding apparatus which includes p-pieces (p is a submultiple of the stage number m) of node processing modules (minimum-value calculating devices or integration devices).

As described, the first exemplary embodiment is structured and functions as above. According to that, for encoding the transmission data sequences, it is basically structured to perform a plurality of kinds of encoding, i.e., execute encoding of the m-stage quasi-cyclic low density parity check encoding is executed by using one of the encoding modules and further execute encoding of the redundant sequences replaced and outputted via the data replacing module by using the other encoding module. Therefore, it is possible to provide the error correction encoding apparatus, the encoding method, and the program thereof, which can achieve such an excellent effect that the encoding gain is greatly improved by the increase of the frame length.

Further, when decoding the encoded data sequences, the decoding processing corresponding to the m-stage quasi-cyclic low density parity check codes same as the case of encoding the transmission data sequences described above is executed on the reception side even when the data sequences of the increased frame length are transmitted. Thus, it becomes possible to perform the decoding processing without increasing the circuit scale and the number of memories to be used. This makes it possible to provide the decoding apparatus, the decoding method, and the program thereof, which can provide excellent effects of increasing the speed of decoding processing and suppressing the power consumption at the time of operating the decoding processing.

Second Exemplary Embodiment

Next, a second exemplary embodiment of the present invention will be described by referring to FIG. 10.

Note here that the same reference numerals are applied to the same structural members as those of the first exemplary embodiment.

Figure 10:
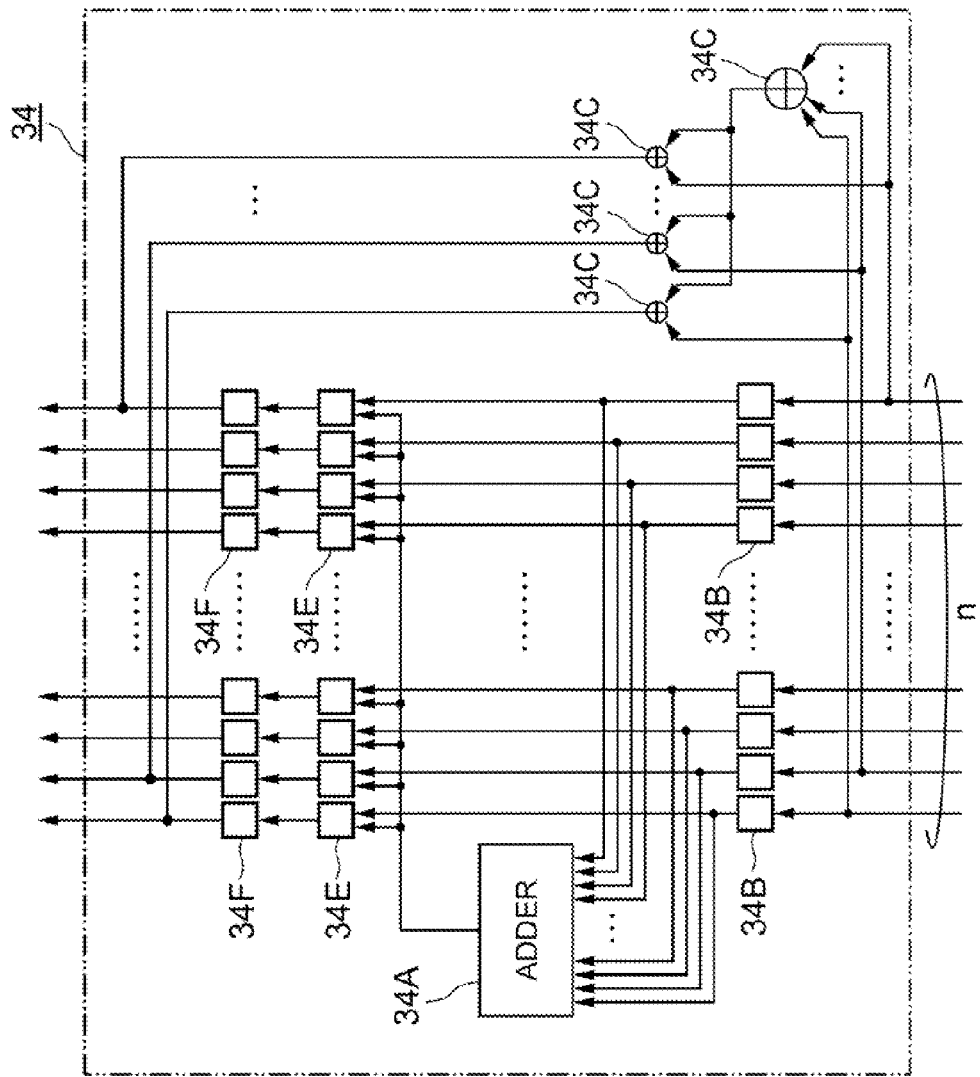
FIG. 10 is a block diagram showing an example of an integration circuit (integration device) provided as a node processing module which constitutes a part of a decoding apparatus according to a second exemplary embodiment of the present invention.

The second exemplary embodiment is so characterized that a decoding apparatus 20 includes an integration circuit (an integration device) 34 shown in FIG. 10 instead of the minimum-value calculating module provided as each of the node processing units $24_0$, $24_1$, $24_2$, - - - , $24_{p-1}$ which constitute the node processing module 24. Other structures are the same as the contents disclosed in FIG. 2 described above. Further, the encoding apparatus 10 disclosed in FIG. 1 is also employed to the second exemplary embodiment without any changes.

The integration circuit 34 shown in FIG. 10 includes a plurality of adders 34A, first and second conversion tables 34B, 34F, exclusive OR circuits 34C, and subtractors 34E by corresponding to each of a plurality of data sequences.

As disclosed in the decoding apparatus 20 of the first exemplary embodiment described above (see FIG. 2), each of the node processing units $24_0$, $24_1$, $24_2$, - - - , $24_{p-1}$ of the node processing module 24 inputs the data of one symbol (n symbols in total) out of the data originated from the n-pieces of the RAMs $21_0$, $21_1$, $21_2$, - - - , $21_{n-1}$.

The integration circuit 34 shown in FIG. 10 also has a function of inputting n-pieces of symbols $Y_0$, $Y_1$, - - - , $Y_{n-1}$ from the n-pieces of the RAMs $21_0$, $21_1$, $21_2$, - - - , $21_{n-1}$ and outputting $(-1)^{q0}X_0$, $(-1)^{q1}X_1$, - - - , $(-1)^{qn-1}X_{n-1}$.

Note here that $X_i$ can be given by a following Expression 13 (i is an integer between 0 and n−1). Further, $q_i$ can be given by Expression 11 described above.

$$X_i = T^{-1}\left(\sum_{j\neq i} T(Y_j)\right)$$ [Expression 13]

Note here that T(Y) in Expression 13 is given by a following Expression 14.

$$T(Y)=-\ln[\tan h(|Y|/2)]$$ [Expression 14]

As shown in FIG. 10, the first conversion table 34B is structured to output T(Y) of Expression 14 for an input symbol Y according to a request from outside. Further, the second conversion table 34E functions as a table which outputs a symbol X that satisfies T(X)=Y for the input data Y (an inverse function of T(Y) is put into a table in advance).

In the meantime, unlike the case of using the minimum-value calculating modules shown in FIG. 6 described above, the output data "$(-1)^{q0}X_0$, $(-1)^{q1}X_1$, - - - , $(-1)^{qn-1}X_{n-1}$" shown in FIG. 10 in that state are inputted to the second delay element 28 described above in the second exemplary embodiment where the integration circuit 34 shown in FIG. 10 is used as the node processing module 24.

Other structures and the working effects thereof are the same as the case of the first exemplary embodiment described above.

The functions of each of the structural elements described above and the associative functions between each of the structural elements may be put into executable programs to be executed by a computer. The programs are recorded on recording media and handled as subjects of commercial dealings.

As described, the second exemplary embodiment uses the integration device 34 which functions equivalently with respect to the minimum-value calculating module (FIG. 3) for the node processing module 24. Thus, it is possible to acquire the decoding apparatus 20 capable of achieving the working effects equivalent to the case of the first exemplary embodiment described above. Further, the output of the integration circuit (integration device) 34 as it is can be inputted to the second delay element 28, which makes it possible to perform storing processing of reception data more promptly.

Third Exemplary Embodiment

Next, a third exemplary embodiment of the present invention will be described by referring to FIG. 11.

The third exemplary embodiment is characterized to use a first replacing module 14 as the data replacing module in the error correction encoding apparatus 10 disclosed in FIG. 1 and to additionally provide a second replacing module 44 which inputs each parity part of length s×m of N/m-pieces of encoded sequences encoded by the second encoding module 15, changes the order thereof, and outputs S-pieces of sequences of length N.

Further, there is also provided a third encoding module 45 which includes a plurality of encoding processing units for encoding a part of the S-pieces of sequences of length N as the outputs of the second replacing module 44 with the quasi-cyclic low density parity check codes of m-stages and length N.

Furthermore, each of the parity parts encoded by the third encoding module 45 is outputted as the encoded transmission data like the L-pieces of data sequences encoded by the second encoding module 15.

That is, the third exemplary embodiment is structured to provide the second replacing module 44 on the output side of the second encoding module (m-stage low density parity check encoding module) 15 in the error correction encoding apparatus 10 shown in FIG. 1, and further to provide the third encoding module 45 as the m-stage low density parity check encoding module which functions equivalently with the first encoding module 12 on the output side of the second replacing module 44.

Other structures and the working effects thereof are the same as the case of the first exemplary embodiment described above.

The functions of each of the structural elements described above and the associative response functions between each of the structural elements may be put into executable programs to be executed by a computer. The programs are recorded on recording media and handled as subjects of commercial dealings.

Such structure also makes it possible to generate the encoded sequences of the frame structure shown in FIG. 5, according to the setting of the natural numbers L, n, S described in the structure of FIG. 1, and to perform decoding processing by the decoding apparatus 20 shown in FIG. 2. In this respect, it is possible to acquire the working effects equivalent to the case of the first exemplary embodiment described above.

Fourth Exemplary Embodiment

Figure 12:
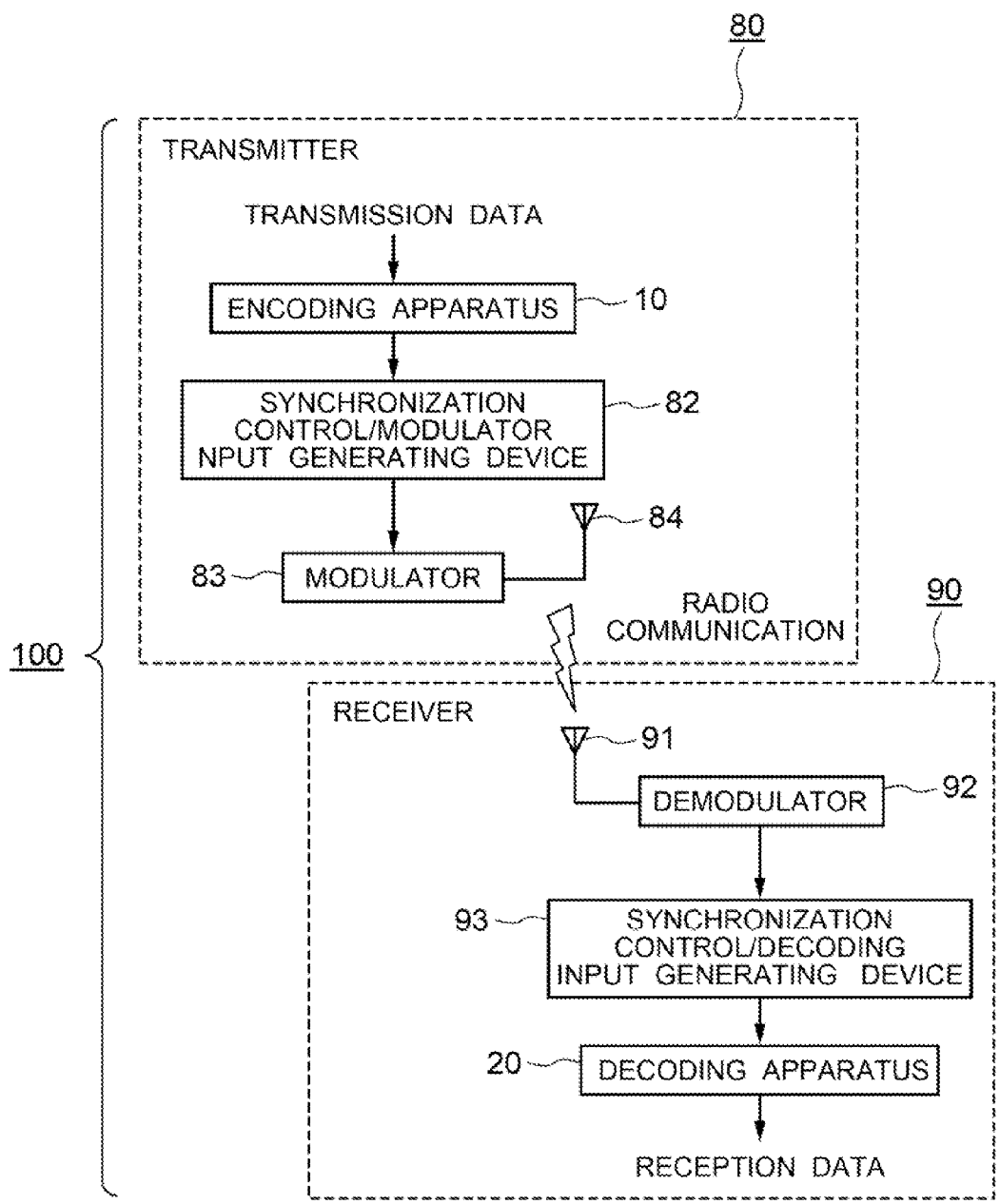
FIG. 12 is an illustration of a fourth exemplary embodiment of the present invention, which is a block diagram showing an example of a case where the error correction encoding apparatus and the decoding apparatus of the first exemplary embodiment shown in FIG. 1 are loaded to a data communication apparatus.

FIG. 12 shows an example of a data communication apparatus 100 which uses the encoding apparatus and the decoding apparatus according to the present invention.

The data transmission side (transmitter 80) is constituted with: the encoding apparatus 10 according to each of the exemplary embodiments of the present invention; synchronization control/modulator input generation device 82 for performing control for frame synchronization and for converting data according to a modulator; and a modulator 83. The output of the modulator 83 is outputted to a radio communication path (or storage device). Reference numeral 84 shows a transmission antenna.

Further, the data reception side (receiver 90) is constituted with: a demodulator 92 for demodulating information acquired from the radio communication path (or storage device); a synchronization control/decoding input generation device 93 which performs processing for converting the output data of the demodulator 92 into the decoder input data and for performing frame synchronization; and the decoding apparatus 20 according to each of the exemplary embodiments of the present invention. Reference numeral 91 shows a reception antenna.

Other structures and the working effects thereof are the same as the case of the first exemplary embodiment described above.

Thereby, the encoding apparatus 10 and the decoding apparatus 20 according to each of the above-described exemplary embodiments effectively function within the transmitter 80 and the receiver 90, so that the data communication smoothly functions on the entire apparatus.

Example 1

Next, a more specific EXAMPLE of the error correction encoding apparatus 10 and the decoding apparatus 20 according to the first exemplary embodiment will be described by using numerical value examples.

In the encoding processing apparatus 10 shown in FIG. 1, it is assumed that the natural numbers L, n, S are L=63, n=65, S=1, respectively, and the target stage number m of the quasi-cyclic low density parity check codes in each of the encoding processing units $12_0$, $12_1$, - - -, $12_{L-1}$ of the first encoding module 12 is 63. In Expression 1 which shows a check matrix of 63-pieces of quasi-cyclic low density parity check codes in each of the encoding processing units $12_0$, $12_1$, - - -, $12_{L-1}$ shown in FIG. 1, it is defined that the row block number r=4, and $I_{0,2}=I_{1,64}=I_{2,63}=I_{3,62}=$(zero matrix of 63×65).

In that case, the output of the first encoding module 12 is 4095 bits (N=m×n=63×65), and 4095×63 bits in total are inputted to the data replacing module 14 shown in FIG. 1.

Note here that the input port number of the data replacing module is "63" and the output port number is "65". The encoded data of 65 blocks as the output of the 63-stage quasi-cyclic low density parity check codes (output of the first encoding module 12) divided into small blocks of 63 bits in block length is inputted to each input port.

Then, the input ports are numbered with integers of 0 to 62, and the output ports are numbered with integers of 0 to 64. The j-th small block of the input port i of the data replacing module 14 (i is and integer between 0 and 62, and j is an integer between 0 and 62) is outputted to the output port that corresponds to a remainder acquired by dividing (65+i−j) by 65.

Each replacement between the input and the output satisfies the condition referred in the explanation of the data replacing module 14 disclosed in FIG. 3. While the shift amount of the cyclic replacing module 16B on the output side of the data replacing module 14 may be defined randomly, it is tentatively assumed that the shift amount corresponds to a remainder acquired by dividing the shift amount (k+h) at the time of the output of the h-th small block (h is a value between 0 and 62) of the cyclic replacing module 168 of the k-th output port (k is an integer between 0 and 64) by 63.

The sequence constituted with small blocks of length 63 outputted from the 65 output ports is encoded by each of the second encoding modules (63-stage low density parity check encoding modules) 15 shown in FIG. 1.

Note here that the row block number in Expression 6 as the check matrix of the second encoding module 15 is defined as $I_{1,0}=1$. The second encoding module 15 outputs 65×63 bits of the parity parts of each of the outputs of the 65-pieces of encoding processing units $15_0$, $15_1$, - - -, $15_{L-1}$ along with the output of 4095×63 bits described above of the first encoding module (63-stage quasi-cyclic low density parity check encoding module) 12.

The frame structure with the numerical value examples, it is defined in FIG. 5 that m=63, N=4095, L=63, and S=1. Through arranging 65×63 bits of the parity parts of the outputs the 65-pieces of first encoding modules (63-stage low density parity check encoding modules) as the lowermost stage data sequence, the condition referred in the explanations of FIG. 5 is satisfied.

When arranging the lowermost stage data sequence by each small block (63 bits in length) from the left side, the parity of 63 bits outputted from the 63-stage low density parity check encoding module (first encoding module) which is directly connected to a small block sequence outputted from the k-th output port of the data replacing module 14 (k is an integer between 0 and 64) is placed at a position which corresponds to a remainder acquired by dividing "65+63−k" by 65, provided that the left end is the 0th small block and the right end is the 64th small block. The decoding apparatus 20 (see FIG. 2) with the numerical value examples comes to include the node processing module 24 including 7-pieces of node processing units and to include 65-pieces of RAMs, provided that p (p is submultiple of m=63) described above is "7", for example.

In that case, the number of steps required for one-time decoding processing is $(63/7)\times63\times4+(63/7)\times65\times1=2853$. This is the lower limit of the delay amount of the second delay element shown in FIG. 2. Further, provided that 1 symbol=7 bits (b=7), bit width of each of the 65-pieces of RAMs is b×p=7×7=49 bits, and the number of words is m/p×(L+S)=9×64=576.

Next, the examples of the numerical values according to EXAMPLE of the exemplary embodiment disclosed in FIG. 11 will be described.

Figure 11:
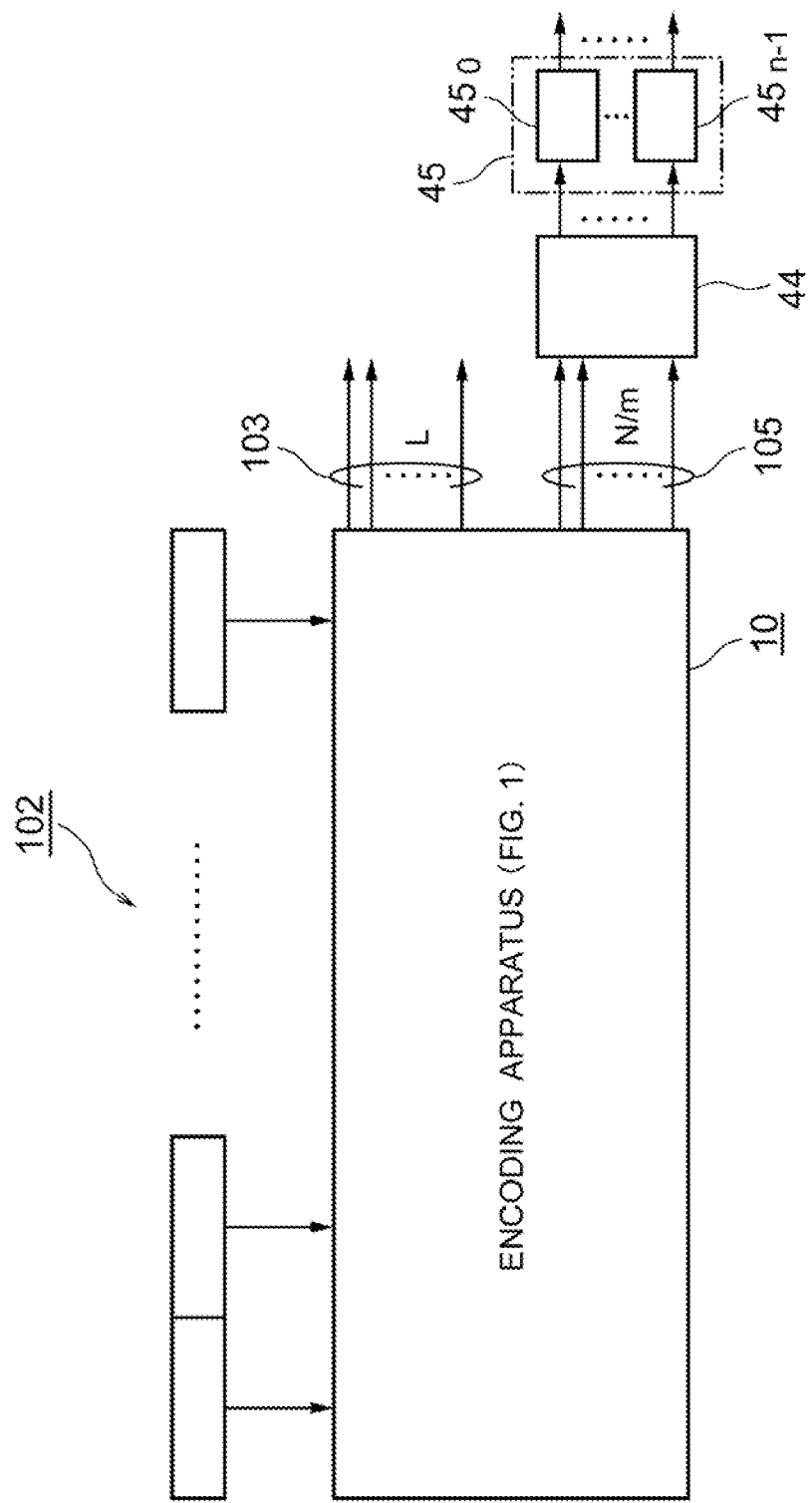
FIG. 11 is an illustration of a third exemplary embodiment of the present invention, which is a block diagram showing another example of the error correction encoding apparatus of the first exemplary embodiment shown in FIG. 1.

Regarding the encoding module part (each of the first and second encoding modules 12 and 15) shown in FIG. 11, the values are same as the numerical value examples described above. That is, it is so defined that L=63, n=65, S=1, and m=63.

The structure of the data replacing module 14 shown in FIG. 1 is also completely the same as the case of the data replacing module 14 using the numerical value examples described above. However, the sequences outputted from the output ports 0, 1, 2, and 64 out of the output ports of the data replacing module 14 are discarded, and the 63-stage quasi-cyclic encoding of the second encoding module 15 arranged after the four output ports is not to be performed.

At this point, the outputs (parity parts of the low density parity check codes shown in FIG. 1) of the lowermost stage of the frame structure shown in FIG. 5 from the left end (0th) to the 60th are allotted to the first encoding module 12 as in the case of the numerical value examples of FIG. 1. However, the 61st to the 64th are empty, since the sequences outputted from the output ports 0, 1, 2, and 64 are discarded.

In EXAMPLE of the exemplary embodiment disclosed in FIG. 11, this part is calculated by using the second data replacing module 44 and the third encoding module (low density parity check encoding module) 45 shown in FIG. 11.

That is, the third replacing module 44 shown in FIG. 11 sequentially outputs the left end (0th) to the 60th of the data sequence of the lowermost stage of the frame structure from the left end (0th), and inputs those to a single 63-stage low density parity check encoding module (the third encoding module) 45. For the 63-stage low density parity check encoding module 45, an encoding module having the same functions as those of the 63-stage low density parity check encoding module (the first encoding module) 12 shown in FIG. 1 is used.

That is, in this EXAMPLE with the numerical value examples, the second replacing module 44 shown in FIG. 11 corresponds to a device which performs parallel/serial conversion by each symbol, and there is a single low density parity check encoding code (the third encoding module) 45 shown in FIG. 11 located on the output side. The parity parts (corresponds to 4 symbols) of the encoded sequence outputted from the third encoding module 45 are allotted to the 61st to the 64th of the lowermost-stage data sequence of the frame structure shown in FIG. 5 described above. The frame structure with the numerical value examples of EXAMPLE satisfies the condition referred in the explanation of FIG. 5.

When it is defined in the decoding apparatus 20 with the numerical value examples as p=7 like the case of the encoding apparatus 10, the decoding apparatus 20 includes a node processing module constituted with 7-pieces of node processing units and 65-pieces of RAMs. Regarding the number of steps required for one-time decoding processing, the addresses generated by Expression 7 are decreased since the four low density parity check codes in the second encoding module 15 shown in FIG. 1 are discarded, and the addresses generated by Expression 5 are increased since one of the low density parity check codes used in the third encoding module 45 shown in FIG. 11 is the same as the low density parity check code shown in FIG. 1.

Therefore, it becomes $(63/7)\times(63+1)\times4+(63/7)\times(65-4)\times1=2853$ in total. This is the lower limit value of the delay amount of each delay element unit of the second delay element of the decoding apparatus 20 as in the case of the numerical value examples described above. Further, provided that 1 symbol=7 bits (b=7), bit width of each of the 65-pieces of RAMs is b×p=7×7=49 bits, and the number of words is m/p×(L+S)=9×64=576. Thus, the scale of the decoding apparatus 20 becomes the same as the case of the numerical value examples of the encoding apparatus 10 shown in FIG. 1.

The specific functions provided to each of the structural elements and specific associative functions between the structural elements may be put into executable programs to be executed by a computer. The programs are recorded on recording media and handled as subjects of commercial dealings.

While the present invention has been described heretofore by referring to the embodiments (and EXAMPLE), the present invention is not limited only to the embodiments (and EXAMPLE). Various changes and modifications occurred to those skilled in the art can be applied to the structures and details of the present invention without departing from the scope of the present invention.

This Application is the National Phase of PCT/JP2009/070756, filed Dec. 11, 2009, which claims the Priority right based on Japanese Patent Application No. 2008-330910 filed on Dec. 25, 2008 and the disclosure thereof is hereby incorporated by reference in its entirety.

INDUSTRIAL APPLICABILITY

The present invention can be applied as an error correction technique for satisfying requirements in terms of the system structure such as reducing the required power and reducing the size of antennas in satellite communications and mobile communication systems or as an error correction technique for improving the reliability regarding storage devices of magnetic recording and the like, for example.

| REFERENCE NUMERALS | |
| --- | --- |
| 10 | Error correction encoding apparatus |
| 11 | Data dividing unit |
| 12 | First encoding module (quasi-cyclic low density parity encoding module) |
| $12_0, 12_1, \ldots, 12_{L-1}$ | Encoding processing unit |
| 13 | Redundant sequence output module |
| 14 | Data replacing module (first replacing module) |
| 14A | Short-sequence dividing unit |
| 14B | Selector |
| 14C | Cyclic replacing unit |
| $14C_0, 14C_1, \ldots, 14C_{L-1}$ | Cyclic replacing circuit |
| 15 | Second encoding module (quasi-cyclic low density parity encoding module) |
| $15_0, 15_1, \ldots, 15_{n-1}$ | Encoding processing unit |
| 20 | Decoding apparatus |
| 20A | Memory controller |
| 21 | Data storage module |
| $21_0, 21_1, \ldots, 21_{n-1}$ | Data storage unit |
| 23, 33 | Cyclic shift module |
| $23_0, 23_1, \ldots, 23_{n-1}$ | Cyclic shift unit |
| 24 | Node processing module |
| $24_0, 24_1, \ldots, 24_{p-1}$ | Node processing unit (minimum-value calculation module, integration circuit) |
| 24A, 24B | 2/4 data processing unit |
| 24C | Demultiplexer |

-continued

| REFERENCE NUMERALS | |
|---|---|
| 24D | Exclusive OR circuit |
| 25 | Subtractor |
| 26 | First delay element |
| $26_0, 26_1, \text{---}, 26_{n-1}$ | Delay element unit |
| 28 | Second delay element |
| 29 | Adder |
| $34_0, 34_1, \text{---}, 34_{p-1}$ | Node processing unit (integration circuit) |
| 34A | Adder of integration circuit |
| 34B | First conversion table |
| 34C | Exclusive OR circuit |
| 34E | Subtractor of integration circuit |
| 34F | Second conversion table |
| 44 | Second replacing module |
| 45 | Third encoding module |
| 51 | Synchronization control/modulator input generating device |
| 52 | Modulator |
| 61 | Demodulator |
| 62 | Synchronization control/decoding apparatus input generating device |

The invention claimed is:

1. An error correction encoding apparatus, comprising:
a data dividing module which divides a transmission data sequence into L-pieces of short sequences; a first encoding module which encodes each of the divided L-pieces of short sequences to encoded sequences of length N by an m-stage quasi-cyclic low density parity check encoding method (L, m are natural numbers, N is a multiple of m), and output those encoded sequences; and a redundant sequence output module which generates a redundant sequence based on each of the encoded sequences of length N outputted from the first encoding module, and outputs the redundant sequence in a same manner as a plurality of encoded sequences outputted from the first encoding module, wherein
the redundant sequence output module includes: a data replacing module which inputs the L-pieces of encoded sequences of length N encoded by the first encoding module, and outputs each of the data sequences by changing an order thereof; and a second encoding module which encodes each of the replaced encoded sequences outputted from the data replacing module by the m-stage quasi-cyclic low density parity check encoding method, and outputs those encoded sequences, wherein
the data replacing module comprises: a short sequence dividing unit which divides each of the L-pieces of data sequences encoded by the first encoding processing unit into short sequences of length m in a same number as the stage number m of the first quasi-cyclic low density parity check codes; and a data replacement processing unit which changes an order by a unit of (L×N)/m-pieces of short sequences of length m set by the division, and outputs N/m-pieces of sequences of length L×m in maximum.

2. The error correction encoding apparatus as claimed in claim 1, wherein
the data replacement processing unit comprises: a selector which includes L-pieces of input ports and N-pieces of output ports to perform distribution; and a cyclic replacing circuit formed with a plurality of cyclic replacers for performing cyclic replacement of each small block outputted from the selector.

3. The error correction encoding apparatus as claimed in claim 1, wherein
the second encoding module has a function which performs encoding (error correction encoding) on each of the replaced encoded sequences outputted from the data replacing module into sequences of length equal to or less than (L+S)×m (S is a natural number), and outputs those sequences.

4. The error correction encoding apparatus as claimed in claim 1, wherein
the data replacing module is defined as a first replacing module, the encoding apparatus further comprising: a second replacing module which inputs each parity part in length S×m of the N/m-pieces of encoded sequences encoded by the second encoding module and outputs S-pieces of sequence of length N by changing the order; and a third encoding module which performs encoding of a part of the S-pieces of sequences of length N as an output of the second replacing module with third quasi-cyclic low density party check codes of stage number m and length N, wherein
each of the parity parts encoded by the third encoding module is outputted as encoded transmission data like the L-pieces of data sequences encoded by the first encoding module.

5. The error correction encoding apparatus as claimed in claim 3, wherein
the data replacing module has a function of arranging each of the L+S-pieces of small blocks constituting the second low density parity check codes so as not to appear on a same row and a same column, in a case where the L-pieces of first low density parity check code sequences are divided into small blocks of length m among output data encoded by the first encoding module and those are arranged on a higher-order L row of two-dimensional layout of (L+S) rows and (N/m) columns and the N/m-pieces of parity sequences of length S×m of the second low density parity check codes are divided into small blocks of length m and those are arranged in a lower-order S row of the two-dimensional layout of (L+S) rows and (N/m) columns.

6. The error correction encoding apparatus as claimed in claim 4, wherein
the data replacing module has a function of arranging each of the L+S-pieces of small blocks constituting the third low density parity check codes so as not to appear on a same row and a same column, in a case where the L-pieces of first low density parity check code sequences are divided into small blocks of length m among output data encoded by the first encoding module and those are arranged on a higher-order L row of two-dimensional layout of (L+S) rows and (N/m) columns and the S-pieces of third low density parity check encoded sequences of length N are divided into small blocks of length m and those are arranged in a lower-order S row of the two-dimensional layout of (L+S) rows and (N/m) columns.

7. A decoding apparatus for decoding transmitted data encoded by an error correction encoding apparatus and correcting an error when the error is added to the data, the decoding apparatus comprising:
a plurality of data storage modules which, among the data transmitted from the error correction encoding apparatus, separately store data of a plurality of encoded sequences processed by a first encoding module of the error correction encoding apparatus and data of a plurality of encoded sequences processed by a redundant sequence calculating module of the error correction encoding apparatus; a memory controller for controlling storing operations of each of the data storage modules; and a decoding update processing module provided by corresponding to each of the data storage modules to repeat, for number of times specified by the address generating procedure, an update operation which reads out the data held at addresses of each of the data storage modules according to an address generating procedure set in advance, performs update processing, and stores the data again to the same addresses of the original data storage modules, wherein the memory controller has a decoded data output control function which, among the data held at each of the plurality of data storage modules, takes out highest-order bit of each symbol specified by the address generating procedure set in advance in a reversed procedure from that of the time of writing to each of the data storage modules, and outputs those as decoded data, wherein:

N/m-pieces of the data storage modules are provided (N is a natural number, m is a number of stages of the quasi-cyclic low density parity check codes); and each of the data storage modules is formed with RAM (Random Access Memory) with bit number of b×p (b is a natural number, p is a submultiple of m) and word number of m/p×(L+S), the decoding update processing module comprises: a cyclic shift processing unit including N/m-pieces of cyclic shift circuits for performing cyclic shift of the data held at each of the RAMs by an amount set by each b-bit; a node processing module including p-pieces of node processing units mounted on respective output sides of the N/m-pieces of cyclic shift circuits; and a delay element which holds output results from the p-pieces of node processing units, whereby the update operation is executed by a cooperative work of each of those structural elements.

8. A decoding apparatus for decoding transmitted data encoded by an error correction encoding apparatus and correcting an error when the error is added to the data, the decoding apparatus comprising:

a plurality of data storage modules which, among the data transmitted from the error correction encoding apparatus, separately store data of a plurality of encoded sequences processed by a first encoding module of the error correction encoding apparatus and data of a plurality of encoded sequences processed by a redundant sequence calculating module of the error correction encoding apparatus; a memory controller for controlling storing operations of each of the data storage modules; and a decoding update processing module provided by corresponding to each of the data storage modules to repeat, for number of times specified by the address generating procedure, an update operation which reads out the data held at addresses of each of the data storage modules according to an address generating procedure set in advance, performs update processing, and stores the data again to the same addresses of the original data storage modules, wherein the memory controller has a decoded data output control function which, among the data held at each of the plurality of data storage modules, takes out highest-order bit of each symbol specified by the address generating procedure set in advance in a reversed procedure from that of the time of writing to each of the data storage modules, and outputs those as decoded data, wherein:

N/m-pieces of the data storage modules are provided (N is a natural number, m is a number of stages of the quasi-cyclic low density parity check codes); and each of the data storage modules is formed with RAM (Random Access Memory) with bit number of b×p (b is a natural number, p is a submultiple of m) and word number of m/p×(L+S), the decoding update processing module comprises: a cyclic shift processing unit including N/m-pieces of cyclic shift circuits for performing cyclic shift of the data held at each of the RAMs by an amount set by each b-bit; p-pieces of subtractors which receive outputs of each of the cyclic shift processing units; a plurality of first delay elements which hold results of outputs from each of the subtractors; a node processing module including p-pieces of node processing units which receive each of the outputs from each of the subtractors and perform transmission processing; a second delay element which holds output result of each of the node processing module and transmits those to the subtractors; and p-pieces of adders which add each of the outputs of the node processing module and the first delay element and transmits results thereof to each of the RAMs as update information, whereby the update operation is executed by a cooperative work of each of those structural elements.

9. The decoding apparatus as claimed in claim 7, wherein each of the p-pieces of node processing units of the node processing module is formed by a minimum-value calculating module, and each of the minimum-value calculation processing units comprises: a plurality of 2/4 data processing units provided on a data input stage thereof, which receive four pieces of output data out of the output data from each of the subtractors as input data and output two numerical values whose absolute values are small and a number corresponding to the input port to which a numerical value whose absolute values is the minimum is inputted; a plurality of 2/4 data processing units having a same function provided on output side of each of the plurality of 2/4 data processing units in a sequential tournament manner; a demultiplexer having a function which receives outputs of the 2/4 data processing unit located on a final output stage of the 2/4 data processing units, and outputs $X_1$ to the output port of a same number as port number P of the 2/4 data processing unit while outputting $X_0$ to output ports of other numbers; and an exclusive OR circuit which performs a prescribed arithmetic calculation based on the input data, and outputs to outside, whereby the decoding apparatus is provided with a function which outputs the number corresponding to the input port to which the input value with the minimum absolute value is inputted among the input numerical values of k-pieces of input data, and provided with a function which calculates all the exclusive ORs of "k−1"-pieces of highest-order bits selected from entire highest-order bits of the k-pieces of input numerical values.

10. A data communication apparatus, comprising an encoding apparatus on a transmitter side and a decoding apparatus corresponding to the encoding apparatus on a receiver side, wherein the error correction encoding apparatus as claimed in claim 1 is mounted as the encoding apparatus.

11. An error correction encoding method, comprising:

dividing a transmission data sequence into L-pieces of short sequences by a data dividing module;

encoding each of the divided L-pieces of short sequences to encoded sequences of length N by a first encoding module according to an m-stage quasi-cyclic low density parity check encoding method (L, m are natural numbers, N is a multiple of m);

generating a redundant sequence by a redundant sequence output module based on each of the encoded sequences of length N outputted from the first encoding module, and outputting the redundant sequence as redundant sequence data along with a plurality of encoded sequences outputted from the first encoding module;

when outputting the redundant sequence data, inputting the L-pieces of encoded sequences of length N encoded by the first encoding module to a data replacing module, and outputting each of the data sequences by changing an order thereof; and thereafter, performing encoding (error correction encoding) on each of the replaced and outputted encoded sequences by a second encoding module according to the m-stage quasi-cyclic low density parity check encoding method wherein in a step executed by the data replacing module for changing an order of the data sequence with respect to the input data and outputting the data sequence, a short sequence dividing unit executes a step of dividing each of the L-pieces of data sequences encoded by the first encoding processing unit into short sequences of length m in a same number as the stage number m of the first quasi-cyclic low density parity check codes, and a data replacement processing unit executes a step of changing an order by a unit of (L×N)/m-pieces of short sequences of length m set by the division and outputting N/m-pieces of sequences of length L×m in maximum.

12. The error correction encoding method as claimed in claim 11, wherein in a step executed by the data replacement processing unit for changing the order by the unit of short sequence, a selector comprising L-pieces of input ports and N-pieces of output ports executes a distributing step; a cyclic replacing circuit formed with a plurality of cyclic replacers executes a step of performing cyclic replacement of each small block outputted therefrom, whereby the N/m-pieces of sequences of length L×m in maximum are outputted.

13. A non-transitory computer readable recording medium storing an error correction encoding program for causing a computer to execute:

a data dividing processing function which divides a transmission data sequence into L-pieces of short sequences;

a first encoding processing function which performs encoding (error correction encoding on each of the divided L-pieces of short sequences to encoded sequences of length N by an m-stage quasi-cyclic low density parity check encoding method (L, m are natural numbers, N is a multiple of m), and outputs those encoded sequences; and a redundant sequence output processing function which generates a redundant sequence based on each of the encoded sequences of length N generated by executing the first encoding processing function, and outputs the redundant sequence in a same manner as a plurality of encoded sequences generated and outputted by the first encoding processing function, wherein the redundant sequence output processing function includes: a data replacement processing function which inputs the L-pieces of encoded sequences of length N encoded by the first encoding processing function, and performs output processing of each of the data sequences by changing an order thereof; and a second encoding processing function which performs encoding (error correction encoding) on each of the replaced encoded sequences outputted thereby by the m-stage quasi-cyclic low density parity check encoding method, and outputs those encoded sequences, wherein the data replacing processing function executed by the computer includes: a short sequence dividing processing function which divides each of the L-pieces of data sequences encoded by the first encoding processing function into short sequences of length m in a same number as the stage number m of the first quasi-cyclic low density parity check codes; and a data replacement processing function which changes an order by a unit of (L×N)/m-pieces of short sequences of length m set by the division, and outputs N/m-pieces of sequences of length L×m in maximum.

14. The non-transitory computer readable recording medium storing the error correction encoding program as claimed in claim 13, wherein the data replacement processing function executed by the computer includes: a distributing processing function which includes L-pieces of input ports and N-pieces of output ports to perform distribution; and a cyclic replacement function which performs cyclic replacement of each small block outputted from the N-pieces of output ports by being distributed by the distributing processing function.

15. The non-transitory computer readable recording medium storing the error correction encoding program as claimed in claim 13, wherein the second encoding processing function executed by the computer performs processing for encoding (error correction encoding) each of the replaced encoded sequences outputted by the data replacement processing function into sequences of length equal to or less than (L+S)×m (S is a natural number), and for outputting those sequences.

16. The non-transitory computer readable recording medium storing the error correction encoding program as claimed in claim 13, wherein the data replacement processing function is defined as a first replacement processing function, and the encoding program executed by the computer including: a second replacement processing function which inputs each parity part in length S×m of the N/m-pieces of encoded sequences encoded by the second encoding processing function and outputs S-pieces of sequence of length N by changing the order; and a third encoding processing function which performs encoding processing of a part of the S-pieces of sequences of length N acquired by the second replacement processing function with third quasi-cyclic low density party check codes of stage number m and length N, wherein each of the parity parts encoded by the third encoding processing function is output-processed as encoded transmission data like the L-pieces of data sequences encoded by the first encoding processing function.

17. The non-transitory computer readable recording medium storing the error correction encoding program as claimed in claim 15, wherein the data replacement processing function executed by the computer includes a function of performing processing for arranging each of the L+S-pieces of small blocks constituting the second low density parity check codes so as not to appear on a same row and a same column, in a case where the L-pieces of first low density parity check code sequences are divided into small blocks of length m among output data encoded by execution of the first encoding processing function and those are arranged on a higher-order L row of two-dimensional layout of (L+S) rows and (N/m) columns and the N/m-pieces of parity sequences of length S×m of the second low density parity check codes are divided into small blocks of length m and those are arranged in a lower-order S row of the two-dimensional layout of (L+S) rows and (N/m) columns.

18. The non-transitory computer readable recording medium storing the error correction encoding program as claimed in claim 16, wherein the data replacement processing function executed by the computer has a function of performing processing for arranging each of the L+S-pieces of small blocks constituting the third low density parity check codes so as not to appear on a same row and a same column, in a case where the L-pieces of first low density parity check code sequences are divided into small blocks of length m among output data encoded by execution of the first encoding processing function and those are arranged on a higher-order L row of two-dimensional layout of (L+S) rows and (N/m) columns and the S-pieces of third low density parity check encoded sequences of length N are divided into small blocks of length m and those are arranged in a lower-order S row of the two-dimensional layout of (L+S) rows and (N/m) columns.

* * * * *